US009659866B1

(12) United States Patent
Ishigaki

(10) Patent No.: US 9,659,866 B1
(45) Date of Patent: May 23, 2017

(54) THREE-DIMENSIONAL MEMORY STRUCTURES WITH LOW SOURCE LINE RESISTANCE

(71) Applicant: SANDISK TECHNOLOGIES LLC, Plano, TX (US)

(72) Inventor: Toru Ishigaki, Ofuna (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/205,628

(22) Filed: Jul. 8, 2016

(51) Int. Cl.
| | |
|---|---|
| H01L 27/115 | (2006.01) |
| H01L 21/8247 | (2006.01) |
| H01L 23/528 | (2006.01) |
| H01L 27/1157 | (2017.01) |
| H01L 27/11582 | (2017.01) |
| H01L 23/522 | (2006.01) |
| H01L 21/768 | (2006.01) |

(52) U.S. Cl.
CPC ...... *H01L 23/528* (2013.01); *H01L 21/76816* (2013.01); *H01L 21/76877* (2013.01); *H01L 23/5226* (2013.01); *H01L 27/1157* (2013.01); *H01L 27/11582* (2013.01)

(58) Field of Classification Search
CPC .................. H01L 27/11556; H01L 27/11582
See application file for complete search history.

(56) References Cited

U.S. PATENT DOCUMENTS

| | | |
|---|---|---|
| 5,084,417 A | 1/1992 | Joshi et al. |
| 5,807,788 A | 9/1998 | Brodsky et al. |
| (Continued) | | |

FOREIGN PATENT DOCUMENTS

| | | |
|---|---|---|
| JP | 2015-149413 A | 8/2015 |
| WO | WO02/15277 A2 | 2/2002 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Daniel Shook
(74) *Attorney, Agent, or Firm* — The Marbury Law Group PLLC

(57) ABSTRACT

Dielectric pedestal structures embedded in a sacrificial material layer is formed between a substrate and an alternating stack of insulating layers and spacer material layers. After memory openings are formed through the alternating layer, a cavity is formed by removal of the sacrificial material layer selective to the dielectric pedestal structures. A memory film, a semiconductor channel layer, and a dielectric core are sequentially formed in the volume including the cavity and the memory openings. A backside trench is formed through the alternating stack in an area that straddles the dielectric pedestal structures. By recessing the dielectric pedestal structures selective to the semiconductor channel layer, planar regions and vertical regions of the semiconductor channel layer can be physically exposed, which are converted into source regions. Contact resistance can be lowered due the increased contact area provided by vertical source portions.

25 Claims, 13 Drawing Sheets

(56) References Cited

U.S. PATENT DOCUMENTS

| | | |
|---|---|---|
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,378,353 B2 | 5/2008 | Lee et al. |
| 7,514,321 B2 | 4/2009 | Mokhlesi et al. |
| 7,575,973 B2 | 8/2009 | Mokhlesi et al. |
| 7,608,195 B2 | 10/2009 | Wilson |
| 7,648,872 B2 | 1/2010 | Benson |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,093,725 B2 | 1/2012 | Wilson |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 8,445,347 B2 | 5/2013 | Alsmeier |
| 8,461,000 B2 | 6/2013 | Alsmeier et al. |
| 8,580,639 B2 | 11/2013 | Alsmeier et al. |
| 8,765,543 B2 | 7/2014 | Alsmeier et al. |
| 8,884,357 B2 | 11/2014 | Wang et al. |
| 8,987,087 B2 | 3/2015 | Chien et al. |
| 8,987,089 B1 | 3/2015 | Pachamuthu et al. |
| 9,023,719 B2 | 5/2015 | Pachamuthu et al. |
| 9,230,974 B1 | 1/2016 | Pachamuthu et al. |
| 9,230,983 B1 | 1/2016 | Sharangpani et al. |
| 9,230,984 B1 | 1/2016 | Takeguchi et al. |
| 9,379,124 B2 | 6/2016 | Sharangpani et al. |
| 2002/0190379 A1 | 12/2002 | Jian et al. |
| 2006/0102586 A1 | 5/2006 | Lee et al. |
| 2007/0210338 A1 | 9/2007 | Orlowski |
| 2007/0252201 A1 | 11/2007 | Kito et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0256247 A1 | 10/2012 | Alsmeier |
| 2013/0122712 A1 | 5/2013 | Kim et al. |
| 2013/0126957 A1 | 5/2013 | Higashitani et al. |
| 2013/0224960 A1 | 8/2013 | Payyapilly et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0225181 A1 | 8/2014 | Makala et al. |
| 2015/0008505 A1 | 1/2015 | Chien et al. |
| 2015/0076584 A1 | 3/2015 | Pachamuthu et al. |
| 2015/0076585 A1 | 3/2015 | Pachamuthu et al. |
| 2015/0079742 A1 | 3/2015 | Pachamuthu et al. |
| 2015/0179660 A1 | 6/2015 | Yada et al. |
| 2015/0380424 A1 | 12/2015 | Makala et al. |
| 2016/0049421 A1 | 2/2016 | Zhang et al. |
| 2016/0086969 A1 | 3/2016 | Zhang et al. |
| 2016/0141419 A1* | 5/2016 | Baenninger ....... H01L 27/11524 257/314 |
| 2016/0148945 A1 | 5/2016 | Sharangpani et al. |
| 2016/0149002 A1 | 5/2016 | Sharangpani et al. |
| 2016/0149049 A1 | 5/2016 | Sharangpani et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19. 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

Lim et al., "The Effect of CF4 Addition on Ru Etching with Inductively Coupled Plasma," Journal of the Korean Physical Society, vol. 42, Feb. 2003.

Lee et al., "Reactive Ion Etching Mechanism of $RuO_2$ Thin Films in Oxygen Plasma with the Addition of $CF_4$, $Cl_2$, and $N_2$," Abstract from 1998 Jpn. J. Appl. Phys. 37 2634.

Yunogami et al., "Anisotropic Etching of $RuO_2$ and Ru with High Aspect Ratio for Gigabit Dynamic Random Access Memory," Abstract from J. Vac. Sci. Technol. B 18, 1911 (2000).

Elam et al., "Nucleation and Growth During Tungsten Atomic Layer Deposition on $SiO_2$ Surfaces," Thin Solid Films, 386 (2001) pp. 41-52.

Park et al., "Thermal and Plasma Enhanced Atomic Layer Deposition Ruthenium and Electrical Characterization as a Metal Electrode," Microelectronic Engineering 85 (2008) pp. 39-44.

Thompson et al., "Stress Evolution During and After Deposition of Polycrystalline Thin Films," Department of Materials Science and Engineering, Massachusetts Institute of Technology.

R. Abermann, "Measurements of the Intrinsic Stress in Thin Metal Flims," Vacuum vol. 41, Nos. 4-6, pp. 1279-1282, 1990.

U.S. Appl. No. 14/491,026, filed Sep. 19, 2014, SanDisk Technologies Inc.

(56) References Cited

OTHER PUBLICATIONS

U.S. Appl. No. 14/602,491, filed Jan. 22, 2015, SanDisk Technologies Inc.
U.S. Appl. No. 14/699,749, filed Apr. 29, 2015, SanDisk Technologies Inc.
U.S. Appl. No. 14/703,367, filed May 4, 2015, SanDisk Technologies Inc.
U.S. Appl. No. 14/723,919, filed May 28, 2015, SanDisk Technologies Inc.
U.S. Appl. No. 14/751,689, filed Jun. 26, 2015, SanDisk Technologies Inc.
U.S. Appl. No. 14/840,474, filed Aug. 31, 2015, SanDisk Technologies Inc.
U.S. Appl. No. 14/926,347, filed Oct. 29, 2015, SanDisk Technologies Inc.

* cited by examiner

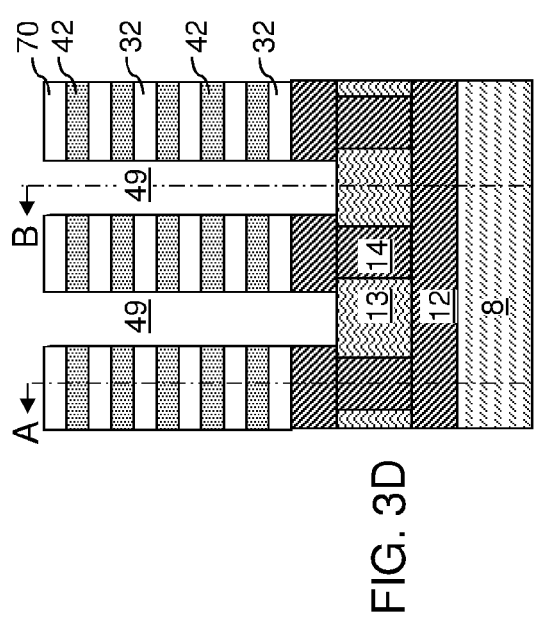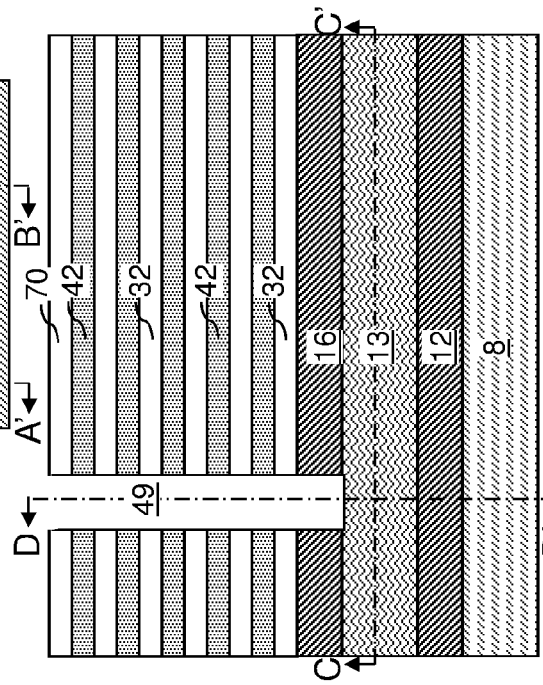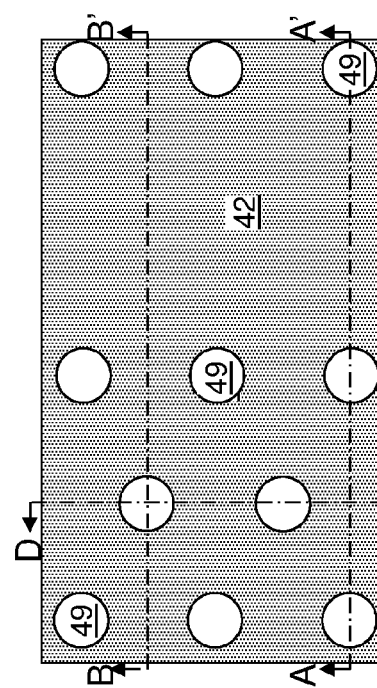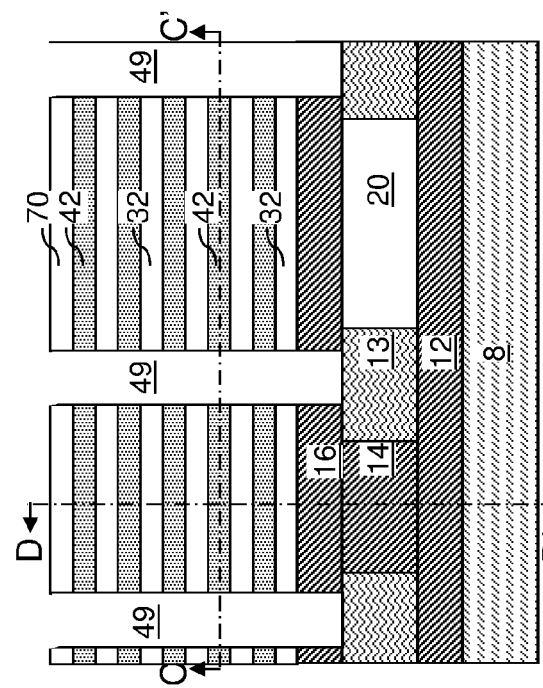

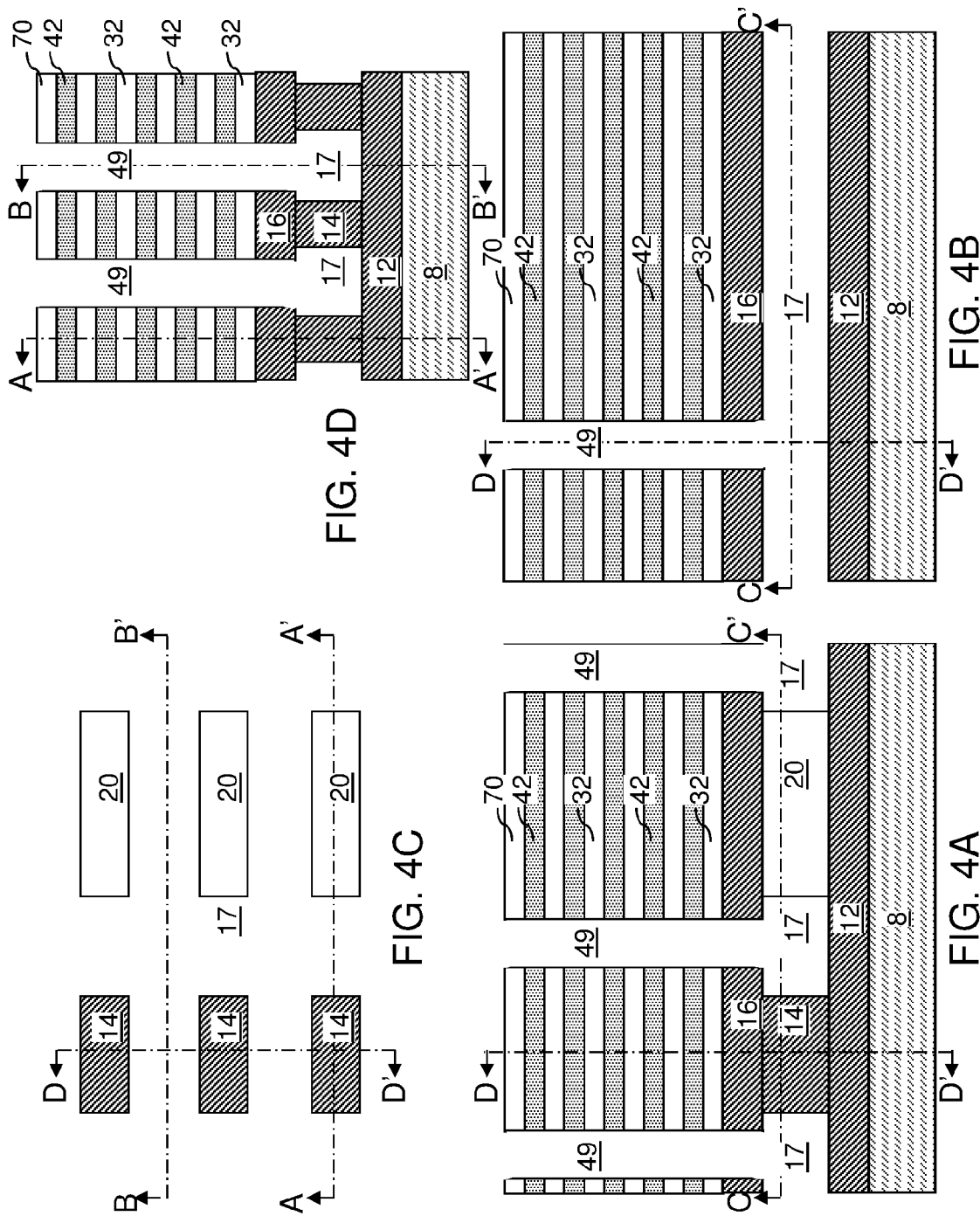

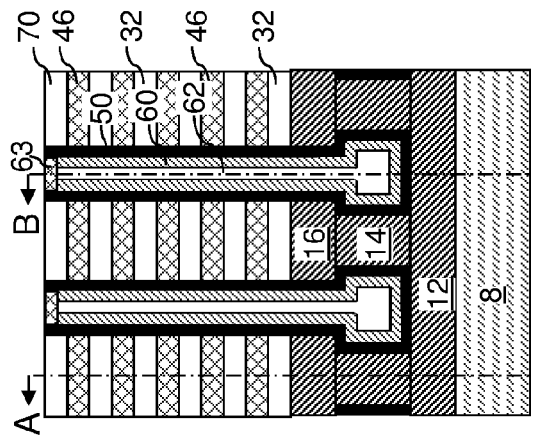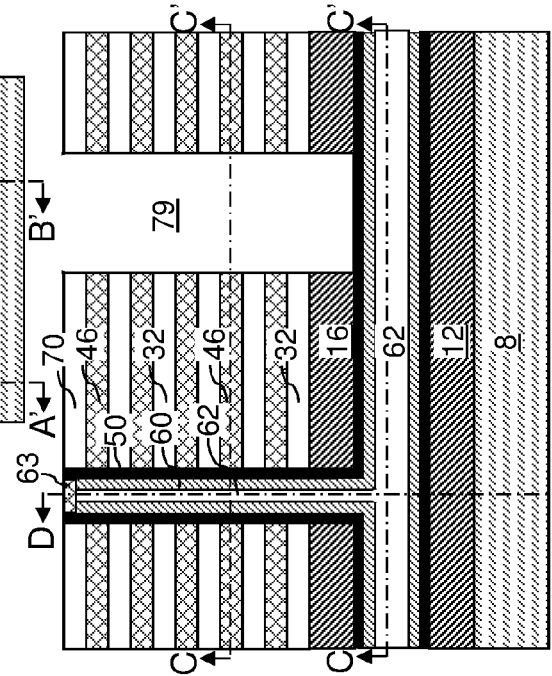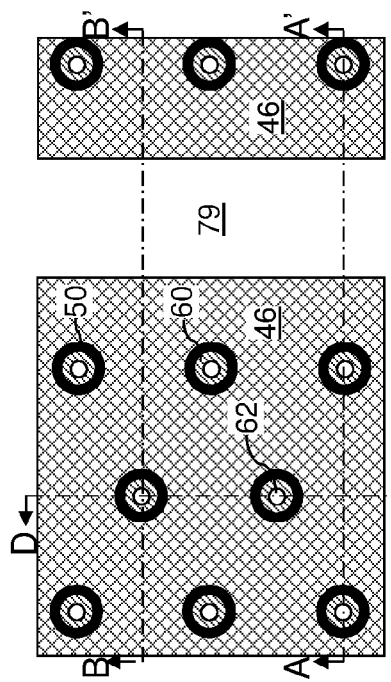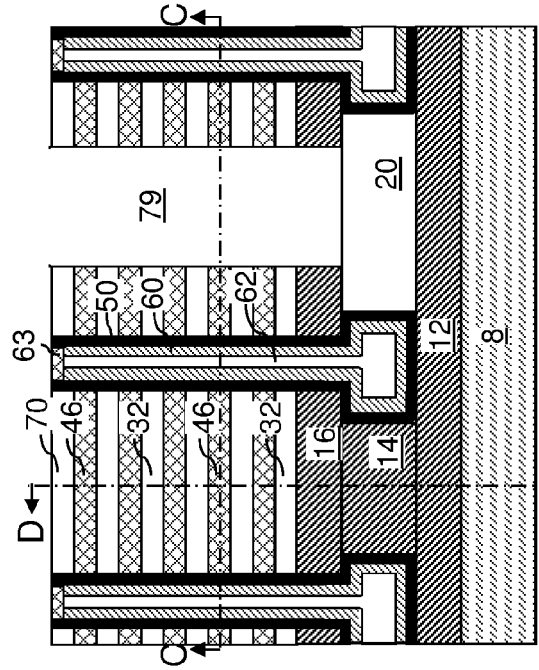

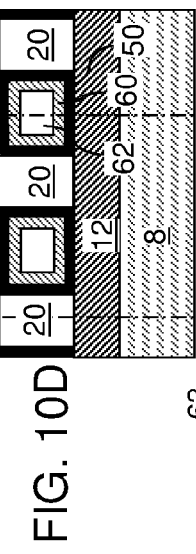
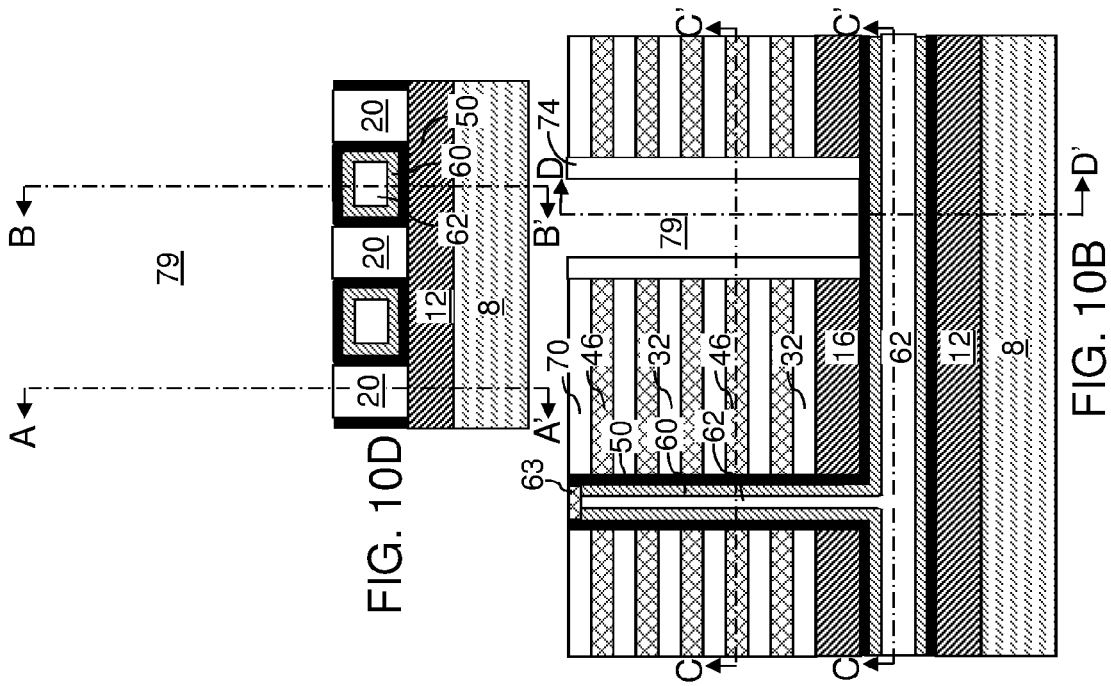
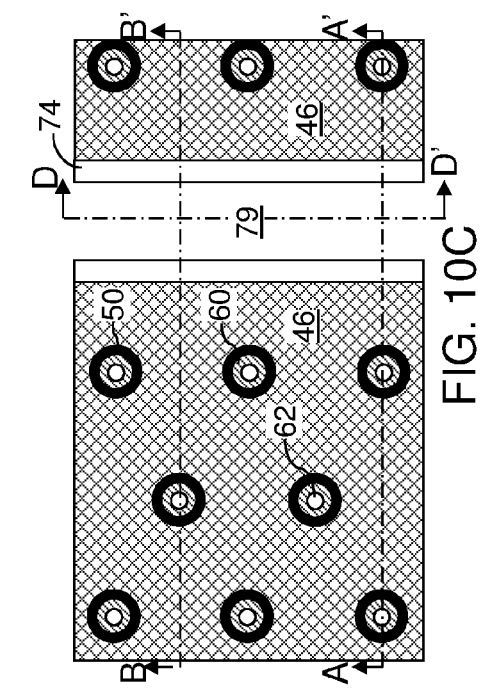
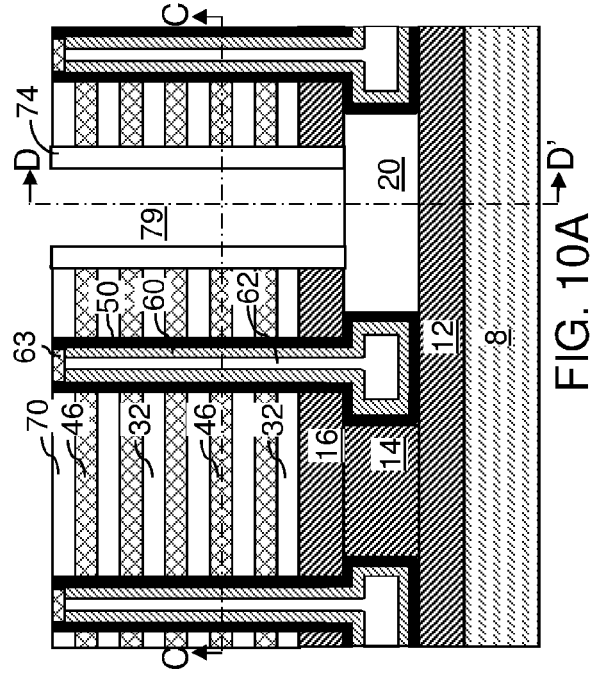

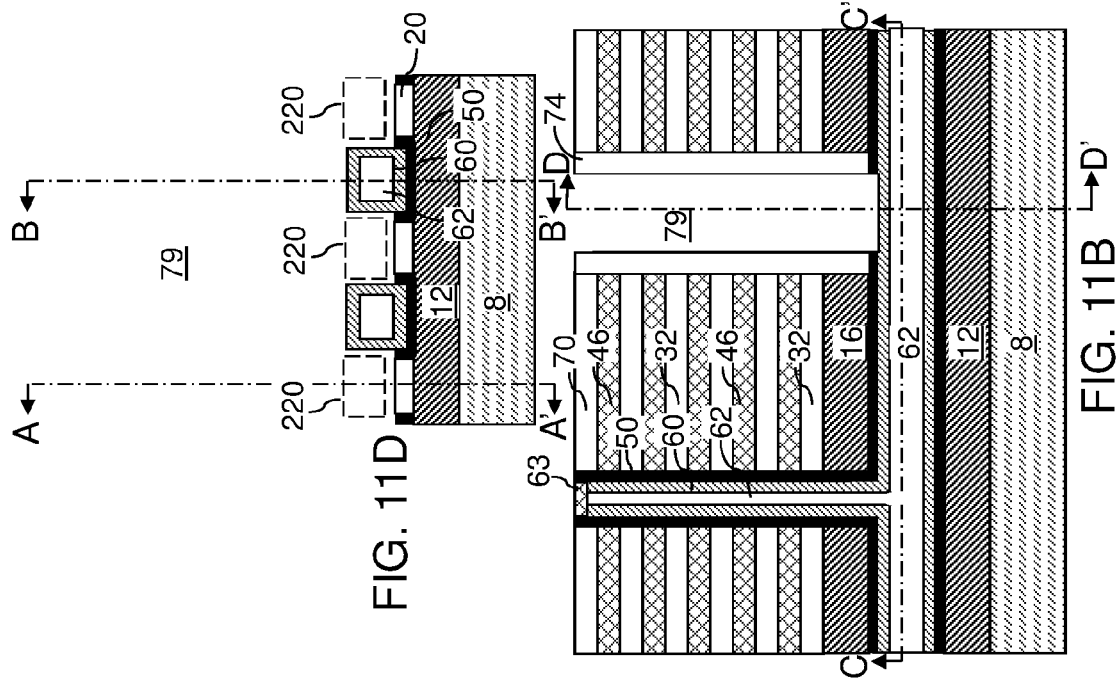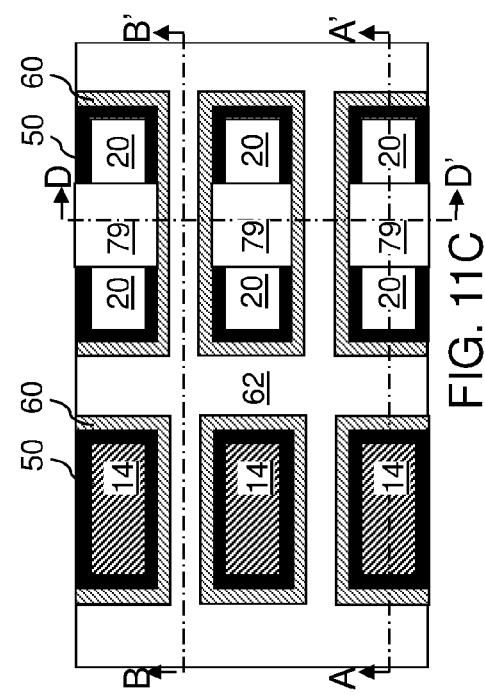

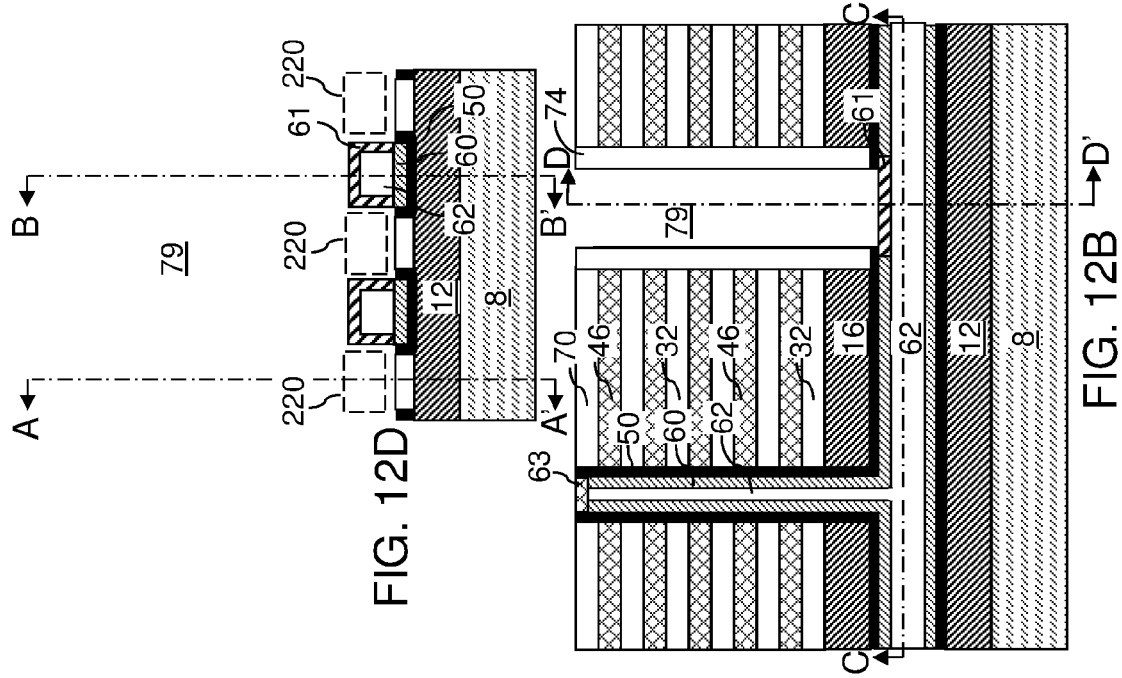
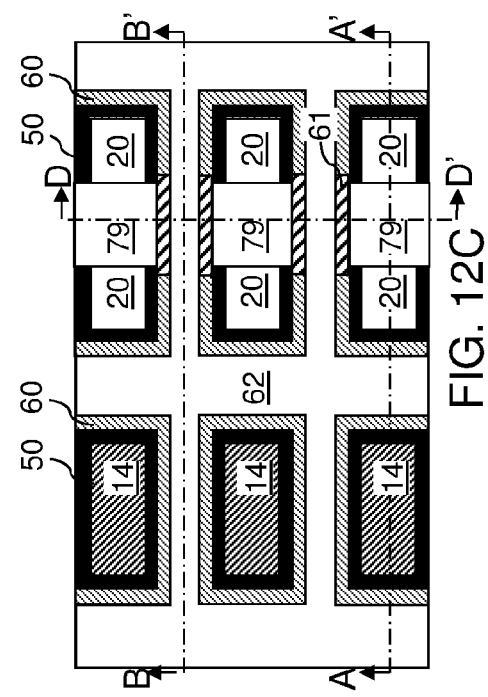
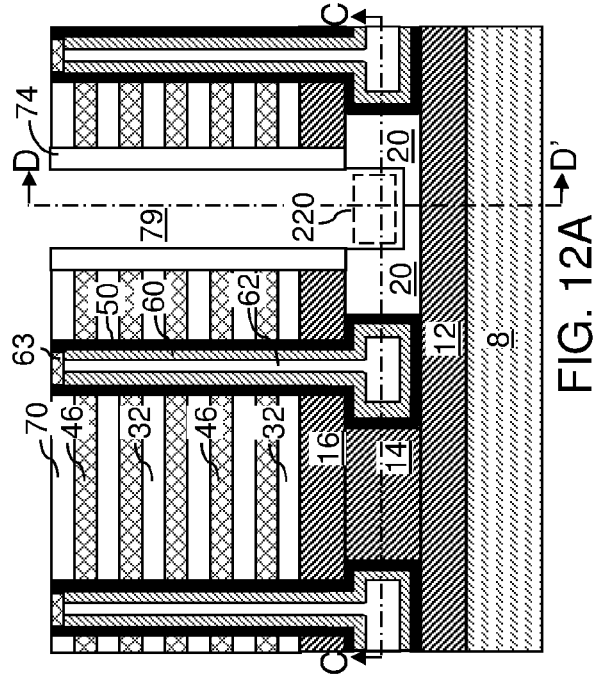

THREE-DIMENSIONAL MEMORY STRUCTURES WITH LOW SOURCE LINE RESISTANCE

FIELD

The present disclosure relates generally to the field of three-dimensional memory devices and specifically to three-dimensional memory devices having low source line resistance and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; a memory stack structure extending through the alternating stack and comprising a vertical portion of a memory film and a vertical portion of a semiconductor channel layer; a laterally-extending portion of the semiconductor channel layer located between the substrate and the alternating stack and adjoined to a bottom end of the vertical portion of the semiconductor channel layer; a source region laterally contacting a sidewall of the laterally-extending portion of the semiconductor channel layer; and a source contact via structure extending through the alternating stack, contacting the source region, and having a corrugated bottom surface including raised horizontal bottom surface portions and recessed horizontal bottom surface portions adjoined by interconnecting sidewall surfaces.

According to another aspect of the present disclosure, a method of forming a device structure is provided. Dielectric pedestal structures embedded within a sacrificial material layer are formed over a substrate. An alternating stack of insulating layers and spacer material layers is formed over the sacrificial material layer and the dielectric pedestal structures. The spacer material layers are formed as, or are subsequently replaced with, electrically conductive layers. Memory openings extending through the alternating stack and down to the sacrificial material layer. The sacrificial material layer is removed selective to the dielectric pedestal structures and the alternating stack. A memory film and a semiconductor channel layer are deposited in a cavity formed by removal of the sacrificial material layer and in the memory openings. A backside trench is formed through the alternating stack within an area that straddles the dielectric pedestal structures. Sidewalls of the semiconductor channel layer are physically exposed to the backside trench. Physically exposed regions of the semiconductor channel layer underneath the backside trench are converted into source regions by introducing electrical dopants therein. A source contact via structure is formed within the backside trench.

BRIEF DESCRIPTION OF THE DRAWINGS

In the figures including one or more planes of cross-sectional views, the letters represent the plane of the cross-sectional view for the figure having the same prefix numeral as the respective figure and having the same suffix letter as the letter represented by the respective plane. For example, the plane A-A' in FIGS. 1C and 1D represents the plane of the cross-sectional view for FIG. 1A, the plane B-B' in FIGS. 1C and 1D represents the plane of the cross-sectional view for FIG. 1B, the plane C-C' in FIGS. 1A and 1B represents the plane of the cross-sectional view of FIG. 1C, the plane D-D' in FIGS. 1A, 1B, and 1C represents the plane of the cross-sectional view for FIG. 1D, etc.

FIG. 3A is a first vertical cross-sectional view of the exemplary structure after formation of memory openings through the alternating stack according to an embodiment of the present disclosure.

FIG. 3B is a second vertical cross-sectional view of the exemplary structure of FIG. 3A.

FIG. 3C is a horizontal cross-sectional view of the exemplary structure of FIGS. 3A and 3B along the plane C-C'.

FIG. 3D is a third vertical cross-sectional view of the exemplary structure of FIGS. 3A, 3B, and 3C along the plane D-D'.

FIG. 4A is a first vertical cross-sectional view of the exemplary structure after formation of a cavity by removing the sacrificial material layer according to an embodiment of the present disclosure.

FIG. 4B is a second vertical cross-sectional view of the exemplary structure of FIG. 2A.

FIG. 4C is a horizontal cross-sectional view of the exemplary structure of FIGS. 4A and 4B along the plane C-C'.

FIG. 4D is a third vertical cross-sectional view of the exemplary structure of FIGS. 4A, 4B, and 4C along the plane D-D'.

FIG. 9A is a first vertical cross-sectional view of the exemplary structure after formation of electrically conductive layers in the backside recesses according to an embodiment of the present disclosure.

FIG. 9B is a second vertical cross-sectional view of the exemplary structure of FIG. 9A.

FIG. 9C is a horizontal cross-sectional view of the exemplary structure of FIGS. 9A and 9B along the plane C-C'.

FIG. 9D is a third vertical cross-sectional view of the exemplary structure of FIGS. 9A, 9B, and 9C along the plane D-D'.

FIG. 10A is a first vertical cross-sectional view of the exemplary structure after formation of an insulating spacer according to an embodiment of the present disclosure.

FIG. 10B is a second vertical cross-sectional view of the exemplary structure of FIG. 10A.

FIG. 10C is a horizontal cross-sectional view of the exemplary structure of FIGS. 10A and 10B along the plane C-C'.

FIG. 10D is a third vertical cross-sectional view of the exemplary structure of FIGS. 10A, 10B, and 10C along the plane D-D'.

FIG. 11A is a first vertical cross-sectional view of the exemplary structure after extending the backside trench to physically expose top surfaces and sidewalls of a laterally-extending portion of the semiconductor channel layer according to an embodiment of the present disclosure.

FIG. 11B is a second vertical cross-sectional view of the exemplary structure of FIG. 11A.

FIG. 11C is a horizontal cross-sectional view of the exemplary structure of FIGS. 11A and 11B along the plane C-C'.

FIG. 11D is a third vertical cross-sectional view of the exemplary structure of FIGS. 11A, 11B, and 11C along the plane D-D'.

FIG. 12A is a first vertical cross-sectional view of the exemplary structure after conversion of physically exposed portions of the semiconductor channel layer into source regions according to an embodiment of the present disclosure.

FIG. 12B is a second vertical cross-sectional view of the exemplary structure of FIG. 12A.

FIG. 12C is a horizontal cross-sectional view of the exemplary structure of FIGS. 12A and 12B along the plane C-C'.

FIG. 12D is a third vertical cross-sectional view of the exemplary structure of FIGS. 12A, 12B, and 12C along the plane D-D'.

DETAILED DESCRIPTION

Figure 1D:
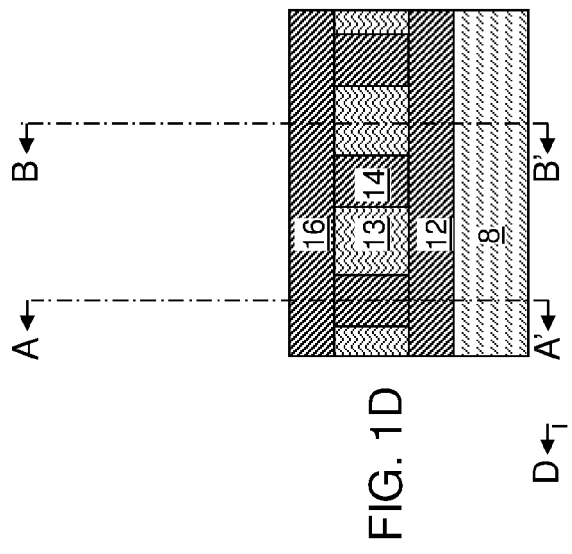
FIG. 1D is a third vertical cross-sectional view of the exemplary structure of FIGS. 1A, 1B, and 1C along the plane D-D'.
Figure 1B:
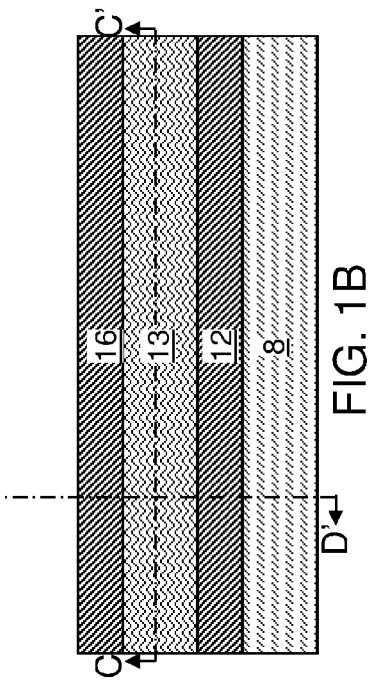
FIG. 1B is a second vertical cross-sectional view of the exemplary structure of FIG. 1A.
Figure 1C:
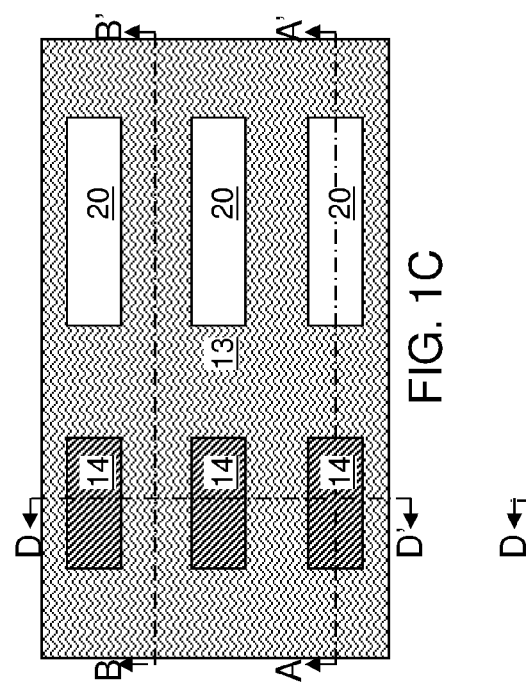
FIG. 1C is a horizontal cross-sectional view of the exemplary structure of FIGS. 1A and 1B along the plane C-C'.
Figure 1A:
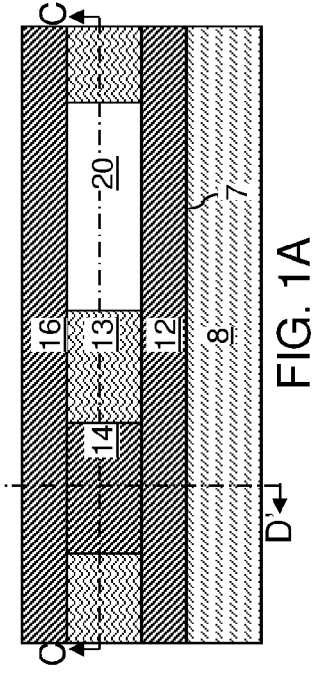
FIG. 1A is a first vertical cross-sectional view of an exemplary structure after formation of a first conductive layer, conductive pedestal structures, dielectric pedestal structures, a sacrificial material layer, and a second conductive layer according to an embodiment of the present disclosure.
Figure 2D:
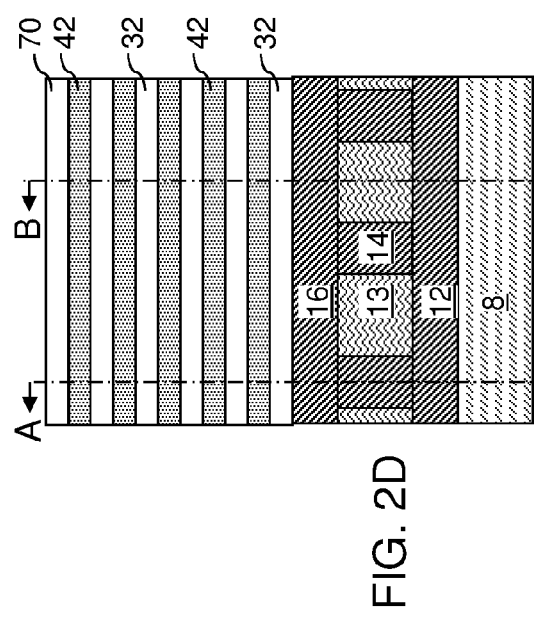
FIG. 2D is a third vertical cross-sectional view of the exemplary structure of FIGS. 2A, 2B, and 2C along the plane D-D'.
Figure 2B:
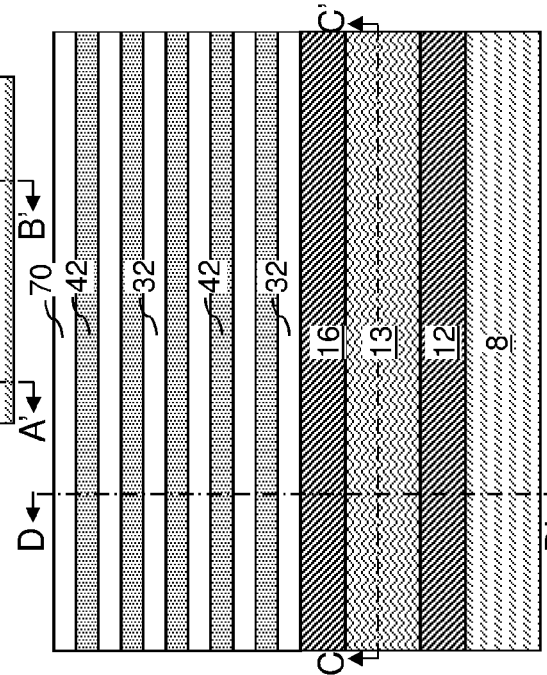
FIG. 2B is a second vertical cross-sectional view of the exemplary structure of FIG. 2A.
Figure 2C:
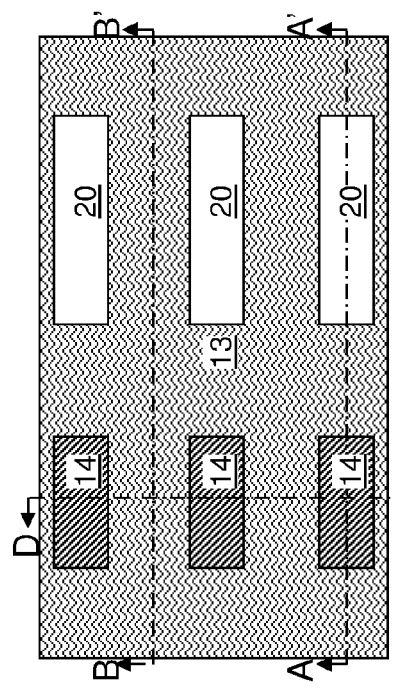
FIG. 2C is a horizontal cross-sectional view of the exemplary structure of FIGS. 2A and 2B along the plane C-C'.
Figure 2A:
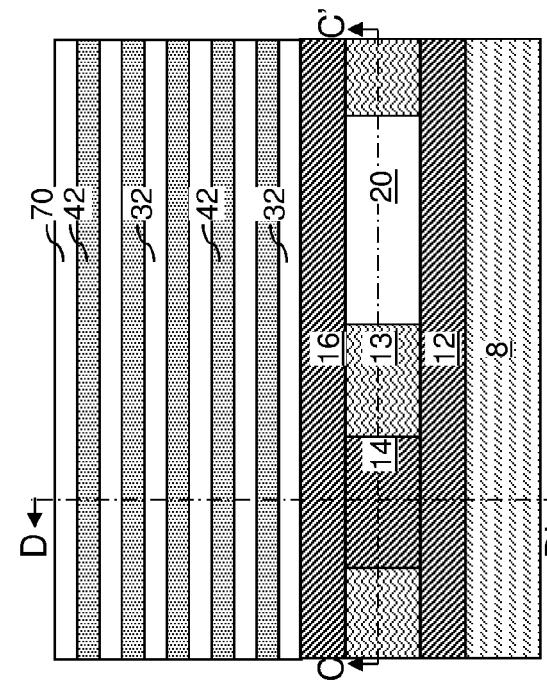
FIG. 2A is a first vertical cross-sectional view of the exemplary structure after formation of an alternating stack of insulating layers and spacer material layers according to an embodiment of the present disclosure.
Figure 5D:
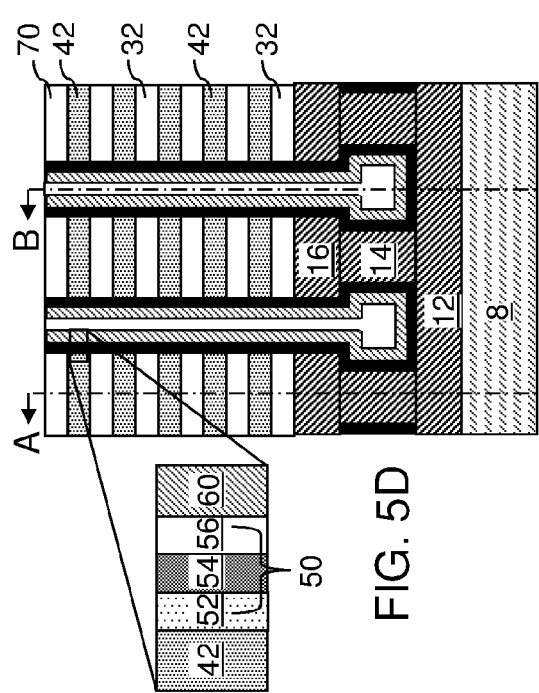
FIG. 5D is a third vertical cross-sectional view of the exemplary structure of FIGS. 5A, 5B, and 5C along the plane D-D'.
Figure 5B:
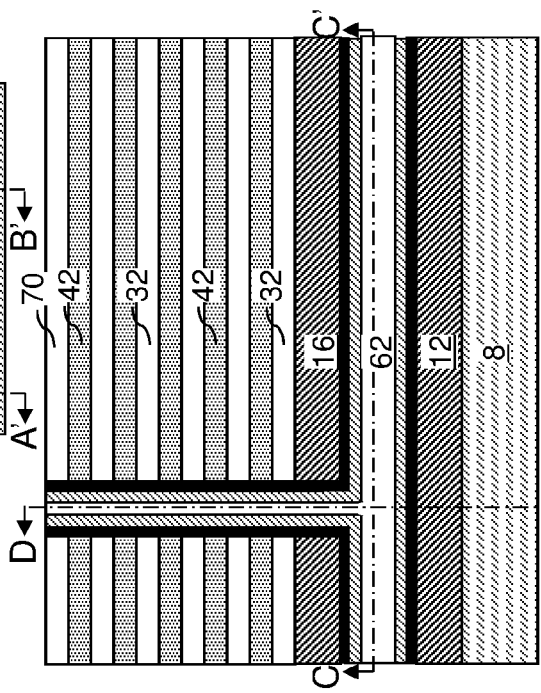
FIG. 5B is a second vertical cross-sectional view of the exemplary structure of FIG. 5A.
Figure 5C:
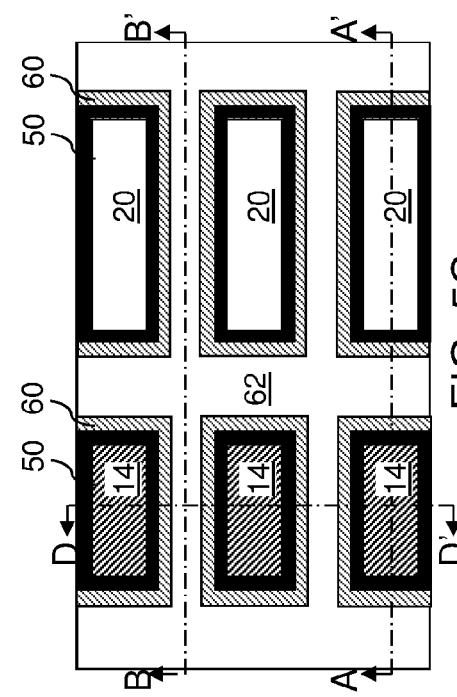
FIG. 5C is a horizontal cross-sectional view of the exemplary structure of FIGS. 5A and 5B along the plane C-C'.
Figure 5A:
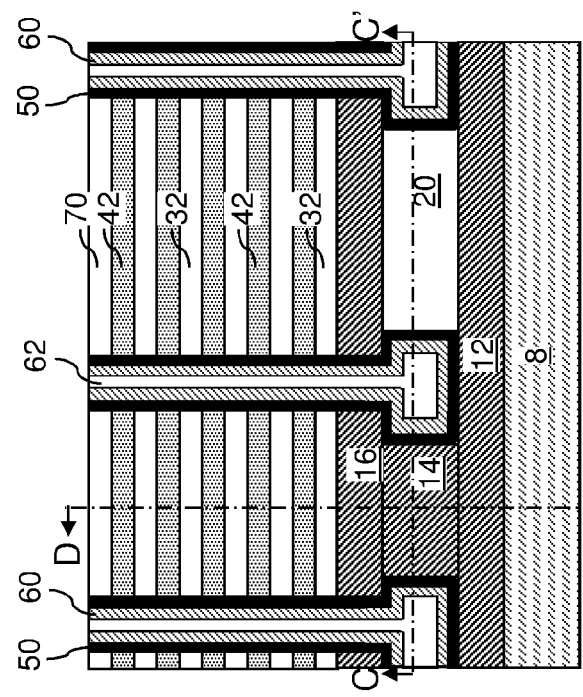
FIG. 5A is a first vertical cross-sectional view of the exemplary structure after formation of a memory film, a semiconductor channel layer, and a dielectric core according to an embodiment of the present disclosure.
Figure 6A:
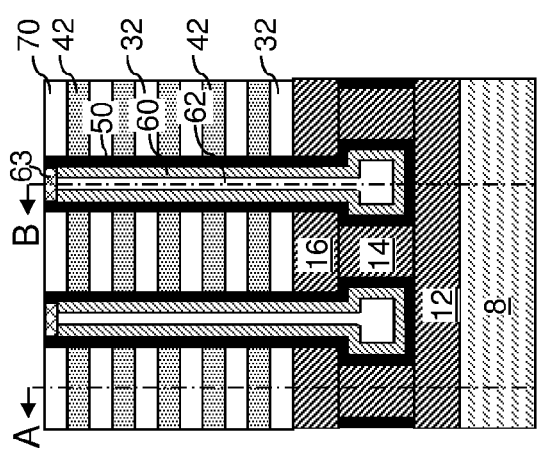
FIG. 6A is a first vertical cross-sectional view of the exemplary structure after formation of drain regions according to an embodiment of the present disclosure.
Figure 6B:
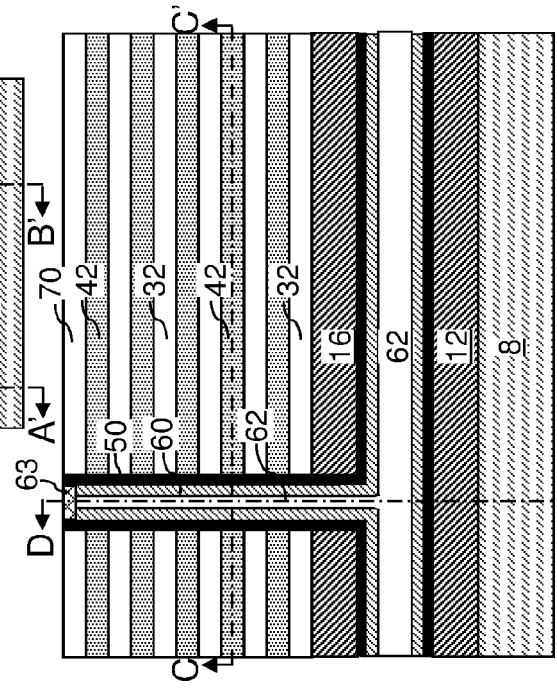
FIG. 6B is a second vertical cross-sectional view of the exemplary structure of FIG. 6A.
Figure 6C:
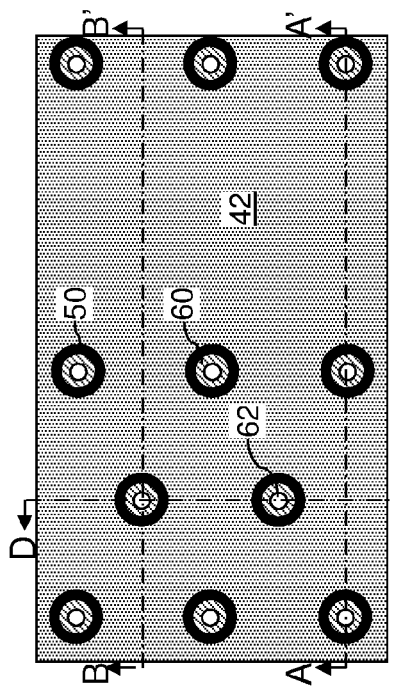
FIG. 6C is a horizontal cross-sectional view of the exemplary structure of FIGS. 6A and 6B along the plane C-C'.
Figure 6D:
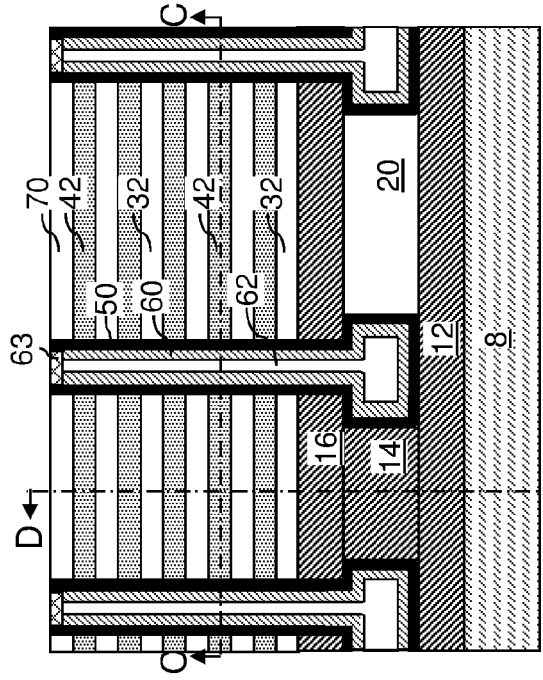
FIG. 6D is a third vertical cross-sectional view of the exemplary structure of FIGS. 6A, 6B, and 6C along the plane D-D'.
Figure 7A:
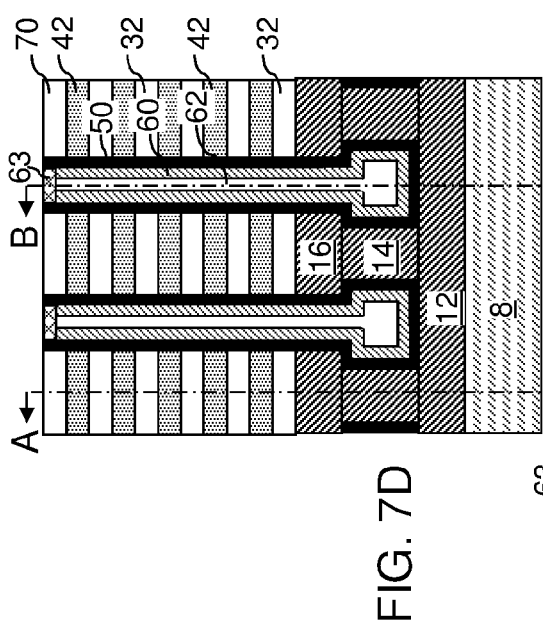
FIG. 7A is a first vertical cross-sectional view of the exemplary structure after formation of a backside trench to a top surface of the second conductive layer according to an embodiment of the present disclosure.
Figure 7B:
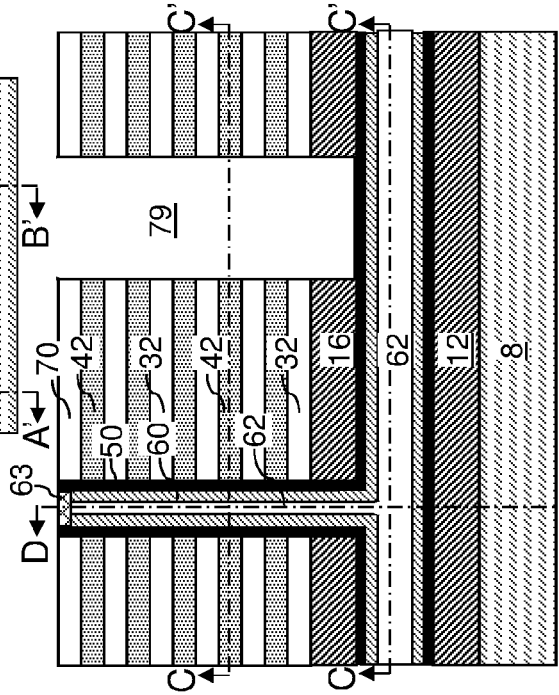
FIG. 7B is a second vertical cross-sectional view of the exemplary structure of FIG. 7A.
Figure 7C:
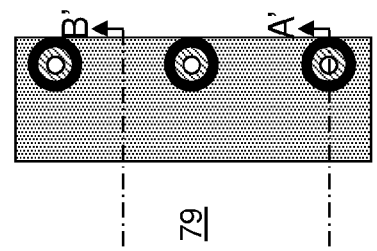
FIG. 7C is a horizontal cross-sectional view of the exemplary structure of FIGS. 7A and 7B along the plane C-C'.
Figure 7D:
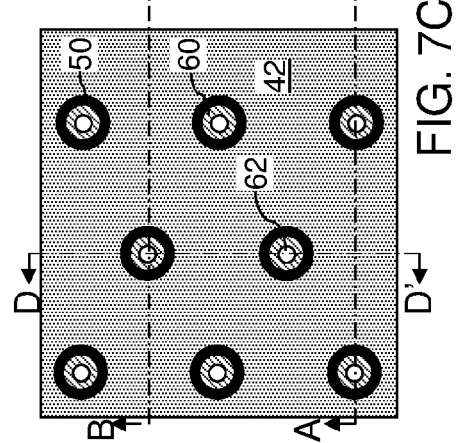
FIG. 7D is a third vertical cross-sectional view of the exemplary structure of FIGS. 7A, 7B, and 7C along the plane D-D'.
Figure 8A:
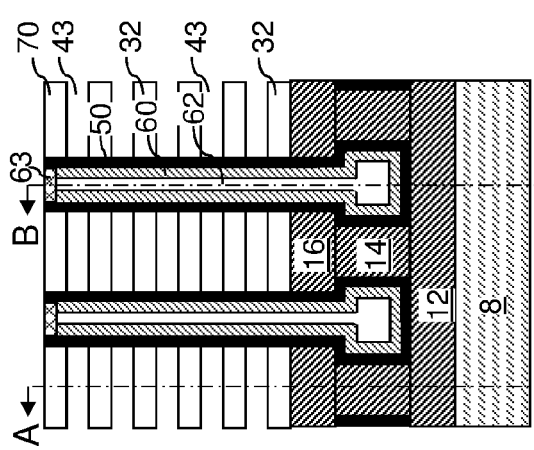
FIG. 8A is a first vertical cross-sectional view of the exemplary structure after forming backside recesses by removing the spacer material layers according to an embodiment of the present disclosure.
Figure 8B:
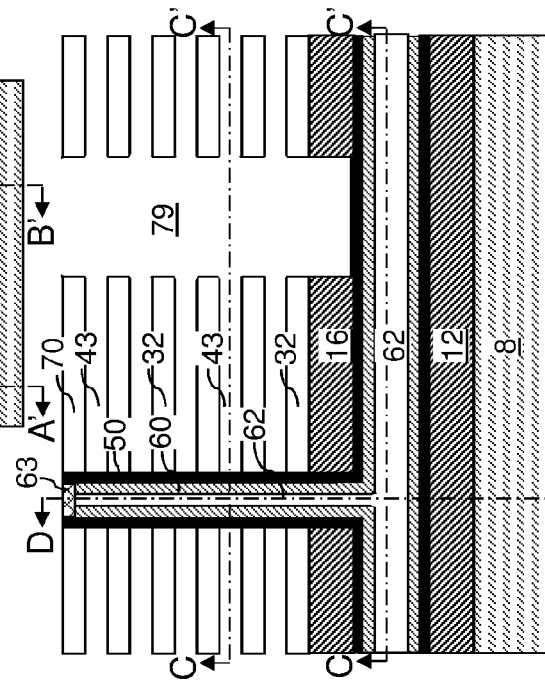
FIG. 8B is a second vertical cross-sectional view of the exemplary structure of FIG. 8A.
Figure 8C:
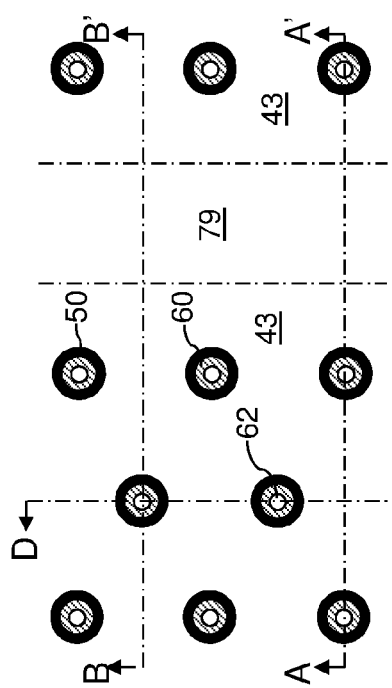
FIG. 8C is a horizontal cross-sectional view of the exemplary structure of FIGS. 8A and 8B along the plane C-C'.
Figure 8D:
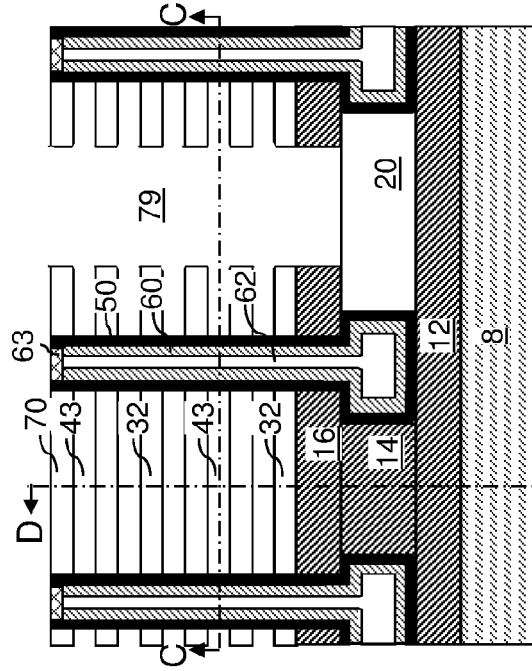
FIG. 8D is a third vertical cross-sectional view of the exemplary structure of FIGS. 8A, 8B, and 8C along the plane D-D'.

As discussed above, the present disclosure is directed to three-dimensional memory devices having low source line resistance and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIGS. 1A-1D, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 8. The substrate semiconductor layer 8 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a top surface 7, which can be a semiconductor surface. In one embodiment, the top surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 8.

A first conductive layer 12 can be formed on the top surface of the substrate semiconductor layer 8. The first conductive layer 12 includes a conductive material, which can be a heavily doped semiconductor material or a metallic material. As used herein, a "heavily doped semiconductor material" is a semiconductor material that is doped with electrical dopants of a sufficiently high concentration to provide electrical conductivity greater than $1.0 \times 10^{5}$ S/cm. For example, the first semiconductor layer 12 can include a heavily p-doped semiconductor material or a heavily n-doped semiconductor material, for example heavily doped polysilicon having at least $1 \times 10^{19}$ cm$^{-3}$, such as $1 \times 10^{19}$ cm$^{-3}$ to $5 \times 10^{21}$ cm$^{-3}$ concentration of p-type dopants (e.g., boron) or n-type dopants (e.g., phosphorus or arsenic). The first conductive layer 12 can be deposited by a conformal or a non-conformal deposition process. The thickness of the first conductive layer 12 can be in a range from 50 nm to 300 nm, although lesser and greater thicknesses can also be employed.

Conductive pedestal structures 14 can be formed over the top surface of the first conductive layer 12. The conductive pedestal structures 14 can be formed as a plurality of discrete structures, and can be distributed as an array over the first conductive layer 12 to provide vertical electrically conductive paths over an array area of the semiconductor structure, i.e., over an area in which an array of memory devices is to be subsequently formed. The conductive pedestal structures 14 can be formed by deposition and patterning of at least one conductive material. In this case, the at least one conducive material can be deposited as a planar layer over the first conductive layer 12, and can be patterned into the conductive pedestal portions 14, by application and patterning of a photoresist layer, and transfer of the pattern in the photoresist layer through the at least one conductive material. Each remaining portion of the at least one conductive material constitutes a conductive pedestal structure 14. The photoresist layer can be subsequently removed. Alternatively, the conductive pedestal structures 14 can be formed by patterning an upper portion of the first conductive layer 12. In this case, the first conductive layer 12 as deposited may be deposited with the thickness that is equal to the sum of the target thickness of the first conductive layer 12 illustrated in FIGS. 1A-1D and the target height for the conductive pedestal structures 14.

The material of the conductive pedestal structures 14 may be the same as, or may be different from, the material of the first conductive layer 12. In case the first conductive layer 12 and the conductive pedestal structures 14 include heavily doped semiconductor materials, the conductivity type of the conductive pedestal structures 14 can be the same as the conductivity type of the first conductive layer 12.

Dielectric pedestal structures 20 are formed over the first conductive layer 12. The dielectric pedestal structures 20 include a dielectric material such as silicon oxide, silicon nitride, a dielectric metal oxide (such as aluminum oxide). The dielectric pedestal structures 20 are formed as a plurality of discrete structures, and can be distributed over an area in which a backside contact via structure (such as a source contact via structure) is subsequently formed. In one embodiment, the dielectric pedestal structures 20 can be laterally spaced from one another along a horizontal direction perpendicular to the direction along which the backside contact via structure extends. In an exemplary configuration, the dielectric pedestal structures 20 can have rectangular horizontal cross-sectional shapes such that the lengthwise edges (the longer edges) of the rectangular horizontal cross-sectional shapes are perpendicular to the lengthwise direction of the backside contact via structure to be subsequently formed.

The dielectric pedestal structures 20 can be formed by deposition and patterning of a dielectric material layer. The dielectric material layer can be formed over the first conductive layer 12 by a conformal or a non-conformal deposition process. Subsequently, a photoresist layer can be applied and patterned over the dielectric material layer, and the pattern in the photoresist layer can be transferred through the dielectric material layer. In case the conductive pedestal structures 14 are formed prior to formation of the dielectric material layer, the etch process that patterns the dielectric material layer into the dielectric pedestal structures 20 can be selective to the materials of the conductive pedestal structures and the first conductive layer 12. The photoresist layer can be subsequently removed.

The height of the dielectric pedestal structures 20 can be the same as, greater than, or less than, the height of the conductive pedestal structures 14. While the present disclosure is described employing an embodiment in which the conductive pedestal structures 14 are formed prior to formation of the dielectric pedestal structures 20, embodiments are expressly contemplated herein in which the dielectric pedestal structures 20 are formed prior to formation of the conductive pedestal structures 14.

A sacrificial material layer 13 can be formed in unfilled volumes among the conductive pedestal structures 14 and the dielectric pedestal structures 20. The sacrificial material layer 13 includes a material that can be removed selective the materials of the first conductive layer 12, the conductive pedestal structures 14, and the dielectric pedestal structures 20. In one embodiment, the sacrificial material layer 13 can include a sacrificial semiconductor material such as undoped silicon (such as undoped amorphous silicon or undoped polysilicon), germanium, or a silicon-germanium alloy, or can include porous organosilicate glass (OSG). As used herein, an undoped semiconductor material refers to a semiconductor material that is not intentionally doped, and includes an intrinsic semiconductor material can include semiconductor materials having electrical dopants at a dopant concentration less than $1.0 \times 10^{16}/cm^3$. The sacrificial material layer 13 can be deposited by a conformal deposition process or a non-conformal deposition process.

The sacrificial material layer 13 can be planarized to remove portions of the deposited sacrificial material from above a horizontal plane including the top surfaces of the conductive pedestal structures 14. In one embodiment, top surfaces of the dielectric pedestal structures 20 can be employed as stopping surfaces during the planarization process. In one embodiment, the planarized sacrificial material layer 13, the conductive pedestal structures 14, and the dielectric pedestal structures 20 can have top surfaces within the same horizontal plane. In an alternative method, sacrificial material layer 13 may be deposited first, then patterned to form openings, followed by depositing the conductive pedestal structures 14 and the dielectric pedestal structures 20 in the openings.

The sacrificial material layer 13 embeds the conductive pedestal structures 14 and the dielectric pedestal structures 20. In one embodiment, the sacrificial material layer 13 can form a criss-cross grid that laterally encloses each of the conductive pedestal structures 14 and the dielectric pedestal structures 20. The enclosed regions defined by the criss-cross grid of the sacrificial material layer 13 can include first regions in which a respective conductive pedestal structure 14 is present and second regions in which a respective dielectric pedestal structure 20 is present.

A second conductive layer 16 can be formed on the top surface of the planarized sacrificial material layer 13, the conductive pedestal structures 14, and the dielectric pedestal structures 20. The second conductive layer 16 includes a conductive material, which can be a heavily doped semiconductor material or a metallic material. If the first conductive layer 12 and the conductive pedestal structures 14 include heavily doped semiconductor materials, the second semiconductor layer 16 can include a heavily doped semiconductor material having the same conductive type as the first conductive layer 12 and the conductive pedestal structures 14. The second conductive layer 16 can be deposited by a conformal or a non-conformal deposition process. The thickness of the second conductive layer 16 can be in a range from 50 nm to 300 nm, although lesser and greater thicknesses can also be employed.

In a non-limiting illustrative example, the first conductive layer 12, the conductive pedestal structures 14, and the second conductive layer 16 can include heavily n-doped silicon (having electrical conductivity greater than $1.0 \times 10^5$ S/cm and having at least $1 \times 10^{19}$ cm$^{-3}$, such as $1 \times 10^{19}$ cm$^{-3}$ to $5 \times 10^{21}$ cm$^{-3}$ concentration of n-type dopants), and the sacrificial material layer 13 can include undoped amorphous silicon, undoped polysilicon, germanium, or a silicon-germanium alloy having an atomic concentration of germanium greater than 40%.

Referring to FIGS. 2A-2D, an alternating stack of first material layers and second material layers is formed over the top surface of the substrate, which can be, for example, on the top surface of the dielectric pad layer 12. As used herein, a "material layer" refers to a layer including a material throughout the entirety thereof. As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer that provides vertical spacing between each vertically neighboring pair of insulating layers 32. In one embodiment, the spacer material layers can be formed as electrically conductive layers.

In another embodiment, the spacer material layers can be formed as sacrificial material layers 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

The upper end of the alternating stack (32, 42) can terminate with an instance of an insulating layer 32. Alternatively, the upper end of the alternating stack (32, 42) can terminate with an instance of a sacrificial material layer 42, and an insulating cap layer 70 having a greater thickness can be formed over the alternating stack (32, 42). The insulating cap layer 70 may have the same composition as, and may a greater thickness than, the insulating layers 32. The insulating cap layer 70 can be deposited, for example, by chemical vapor deposition. In one embodiment, the insulating cap layer 70 can be a silicon oxide layer.

Referring to FIGS. 3A-3D, a lithographic material stack (not shown) including at least a photoresist layer can be formed over the insulating cap layer 70, and can be lithographically patterned to form openings therein. The pattern in the lithographic material stack can be transferred through the insulating cap layer 70 and through entirety of the alternating stack (32, 42), through the second conductive layer 16, and down to the top surface of the sacrificial material layer 13 by at least one anisotropic etch that employs the patterned lithographic material stack as an etch mask. Portions of the alternating stack (32, 42) and the second conductive layer 16 underlying the openings in the patterned lithographic material stack are etched to form memory openings 49. In other words, the transfer of the pattern in the patterned lithographic material stack through the alternating stack (32, 42) and the second conductive layer 16 forms the memory openings 49 that extend through the alternating stack (32, 42) and the second conductive layer 16. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The locations of the memory openings 49 can be selected such that portions of the top surface of the sacrificial material layer 13 are physically exposed underneath the memory openings 49. In one embodiment, the bottom surfaces of the memory openings 49 can consist of surfaces of the sacrificial material layer 13, and does not include surfaces of the conductive pedestal structures 14 or the dielectric pedestal structures 20. In one embodiment, an overetch can be performed partly into the sacrificial material layer 13. Each of the memory openings 49 can include a sidewall (or a plurality of sidewalls) that extends substantially perpendicular to the topmost surface of the substrate semiconductor layer 8. The region in which the array of memory openings 49 is formed is herein referred to as a memory array region. Each of the memory openings 49 can have a lateral dimension (such as the diameter or the major axis) in a range from 30 nm to 120 nm, although lesser and greater lateral dimensions can also be employed.

Referring to FIGS. 4A-4D, an etchant that removes the sacrificial material of the sacrificial material layer 13 selective to the materials of the first and second conductive layers (12, 16), the conductive pedestal structures 14, and the alternating stack (32, 42) can be introduced into the memory openings 49. An isotropic etch, which can be a wet etch or a dry etch, can be employed to etch the sacrificial material layer 13. In an illustrative example, if the sacrificial material layer 13 includes undoped silicon, the first and second conductive layers (12, 16) and the conductive pedestal structures 14 include heavily n-doped silicon, the insulating layers 32 and the dielectric pedestal structures 20 include silicon oxide, and the sacrificial material layers 42 include silicon nitride, trimethyl-2 hydroxyethyl ammonium hydroxide (TMY) can be employed to remove the undoped silicon of the sacrificial material layer 13 without significantly etching other elements collaterally. In another illustrative example, if the sacrificial material layer 13 includes germanium or a silicon-germanium alloy, the first and second conductive layers (12, 16) and the conductive pedestal structures 14 include heavily n-doped silicon, the insulating layers 32 and the dielectric pedestal structures 20 include silicon oxide, and the sacrificial material layers 42 include silicon nitride, a combination of dilute hydrofluoric acid and hydrogen peroxide can be employed to remove the undoped silicon of the sacrificial material layer 13 without significantly etching other elements collaterally.

A laterally extending cavity 17 is formed in the volume from the sacrificial material layer 13 is removed. In one embodiment, the laterally extending cavity 17 can have vertical sidewalls and horizontal surfaces that form a continuous volume that laterally encloses the conductive pedestal structures 14 and the dielectric pedestal structures 20. In one embodiment, first volumes laterally extending along a first horizontal direction and second volumes laterally extending along a second horizontal direction are adjoined to form a cross-cross grid that laterally encloses each of the conductive pedestal structures 14 and the dielectric pedestal structures 20. The enclosed regions defined by the crisscross grid of the laterally extending cavity 17 can include first regions in which a respective conductive pedestal structure 14 is present and second regions in which a respective dielectric pedestal structure 20 is present. In one embodiment, the laterally extending cavity 17 can be connected to bottom portions of the memory openings 49.

Referring to FIGS. 5A-5D, a memory film 50 can be deposited in the continuous volume of the combination of the laterally extending cavity 17 and the memory openings 49. The memory film 50 can include a stack of layers including at least a memory material layer 54. For example, the memory film 50 can include a blocking dielectric layer 52, a memory material layer 54, and a tunneling dielectric layer 56.

The blocking dielectric layer 52 can be deposited on the physically exposed surfaces of each memory opening 49 and the laterally extending cavity 17 by a conformal deposition method. The blocking dielectric layer 52 can include a single dielectric material layer or a plurality of dielectric material layers. In one embodiment, the blocking dielectric layer 52 can include a silicon-based dielectric material such as silicon oxide, silicon oxynitride, silicon nitride, or a combination thereof. In one embodiment, the blocking dielectric layer 52 can include silicon oxide. The silicon-based dielectric material can be formed by a conformal deposition method such as low pressure chemical vapor deposition, atomic layer deposition, or a combination thereof. The thickness of the silicon-based dielectric material, if present, can be in a range from 1 nm to 20 nm, although lesser and greater thicknesses can also be employed. Additionally or alternatively, the blocking dielectric layer 52 can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Alternatively, the blocking dielectric layer 52 can be omitted, and a blocking dielectric layer can be formed after formation of backside recesses by a conformal deposition process on surfaces of memory films to be subsequently formed.

A memory material layer 54 can be subsequently deposited. In one embodiment, the memory material layer 54 can be a charge trapping material including a dielectric charge trapping material, which can be, for example, silicon nitride. The memory material layer 54 can be formed as a single memory material layer of homogeneous composition, or can include a stack of multiple memory material layers. In one embodiment, the memory material layer 54 may comprise an insulating charge trapping material such as silicon nitride. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

A tunneling dielectric layer 56 can be subsequently formed on the memory material layer 54. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon nitride layer or a silicon oxynitride layer, and a second silicon oxide (or oxynitride) layer, which is commonly known as an ONO stack.

In one embodiment, the ONO stack can be formed by deposition of a silicon oxide layer, nitridation of a surface portion of the silicon oxide layer into a silicon nitride layer, and oxidation of a surface portion of the silicon nitride layer into the second silicon oxide layer or a silicon oxynitride layer. In one embodiment, the portion of the initial silicon oxide layer that is not converted into the silicon nitride layer is the first silicon oxide layer within the ONO stack, and the portion of the silicon nitride layer that is converted back into a silicon oxide layer (or a silicon oxynitride layer) is the second silicon oxide layer (or the silicon oxynitride layer) within the ONO stack. Alternatively, the second silicon oxide layer can be formed by deposition of silicon oxide on the inner sidewalls of the silicon nitride layer (or the silicon oxynitride layer) that is formed by nitridation. In one embodiment, the tunneling dielectric layer 56 can be substantially free of carbon. The thickness of the tunneling dielectric layer 56 can be in a range from 2 nm to 20 nm, although lesser and greater thicknesses can also be employed.

A semiconductor channel layer 60 can be deposited on the memory film 50 by a conformal deposition method. The semiconductor channel layer 60 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60 includes amorphous silicon or polysilicon. The semiconductor channel layer 60 can be formed by a conformal deposition method such as low pressure chemical vapor deposition (LPCVD). The thickness of the semiconductor channel layer 60 can be in a range from 2 nm to 10 nm, although lesser and greater thicknesses can also be employed. A vertical cavity is present in the volume of each memory opening 49 that is not filled with the deposited material layers, and a remaining volume of the laterally extending cavity 17 is present between the first and second conductive layers (12, 16). In one embodiment, the semiconductor channel layer 60 can be a single continuous layer including vertical portions located in the memory openings 49 and a laterally-extending portion located between the substrate semiconductor layer 8 and the alternating stack (32, 42) and directly adjoined to each of the vertical portions of the semiconductor channel layer 60.

A dielectric material can be deposited in the continuous volume including the vertical cavities within the memory openings 49 and the remaining unfilled volume of the laterally extending cavity 17. The dielectric material can include undoped silicate glass (USG), doped silicate glass, organosilicate glass, silicon nitride, a dielectric metal oxide, or a combination thereof. In one embodiment, the dielectric material can include silicon oxide (i.e., doped silicate glass or undoped silicate glass). The deposited dielectric material forms a dielectric core 62. The dielectric core 62 can include vertical dielectric core portions laterally surrounded by a respective vertical portion of the semiconductor channel layer 60 and a laterally-extending dielectric core portion surrounded by the laterally-extending portion of the semiconductor channel layer 60 located between the first and second conductive layers (12, 16). In one embodiment, the laterally-extending dielectric core portion can have a horizontal cross-sectional shape of a criss-cross grid that defines enclosed regions of the laterally laterally-extending dielectric core portion.

A planarization process can be performed to remove excess portions of the memory film 50, the semiconductor material layer 60, and the dielectric core 62 from above a horizontal plane including the top surface of the insulating cap layer 70. The planarization process can be performed employing a recess etch, chemical mechanical planarization, or a combination thereof.

Referring to FIGS. 6A-6D, upper region of the vertical portions of the dielectric core 62, and optionally upper portions of the semiconductor channel layer 60 can be removed, for example, by a recess etch from within each memory opening 49 to form vertically recessed regions. A doped semiconductor material can be formed in the vertically recessed regions to form drain regions 63. The doped semiconductor material can be deposited with in-situ doping of a semiconductor material, or can be formed as an intrinsic semiconductor material and subsequently doped with electrical dopants, for example, by ion implantation. Excess portions of the deposited semiconductor material can be removed from above the horizontal plane including the top surface of the insulating cap layer 70, for example, by a recess etch or chemical mechanical planarization. In one embodiment, the drain regions 63 can include a heavily doped semiconductor material having a same conductivity type as the conductivity type of the first and second conductive layers (12, 16).

Referring to FIGS. 7A-7D, a photoresist layer (not shown) can be applied over the alternating stack (32, 42) and the insulating cap layer 70, and is lithographically patterned to form at least one elongated opening in the area that overlies the dielectric pillar structures 20. The pattern in the photoresist layer can be transferred through the alternating stack (32, 42) employing an anisotropic etch to form a backside trench 79. As used herein, a "backside trench" refers to a trench that is formed in an area outside the areas occupied by the memory openings 49. The backside trench 79 extends through the alternating stack (32, 46) and through the second conductive layer 16. In one embodiment, horizontal surfaces of the memory film 50 can be physically exposed at the bottom of the backside trench 79.

In one embodiment, the backside trench 79 is formed through the alternating stack (32, 42) within an area that straddles the dielectric pedestal structures 20. In one embodiment, the at least one backside trench 79 can be a source contact opening in which a source contact via structure can be subsequently formed. An adjoining combination of a vertical portion of the semiconductor channel layer 60 and a vertical portion of the memory film 50 within the same memory opening 49 constitutes a memory stack structure, which includes a plurality of vertically spaced charge storage elements as embodied as portions of the memory material layer 54 located at each level of the sacrificial material layers 42.

Referring to FIGS. 8A-8D, an etchant that selectively etches the second material of the sacrificial material layers 42 with respect to the first material of the insulating layers 32, the material of the second conductive layer 16, and the material of the outermost layer of the memory film 50 can be introduced into the backside trench 79, for example, employing an etch process. Backside recesses 43 are formed in volumes from which the sacrificial material layers 42 are removed. In one embodiment, the sacrificial material layers 42 can include silicon nitride, and the materials of the insulating layers 32 can be selected from silicon oxide and dielectric metal oxides.

The etch process that removes the second material of the sacrificial material layers 42 can be a wet etch process employing a wet etch solution, or can be a gas phase (dry) etch process in which the etchant is introduced in a vapor phase into the backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. In one embodiment, the memory array region can include an array of monolithic three-dimensional NAND strings having a plurality of device levels disposed above the substrate semiconductor layer 8. In this case, each backside recess 43 can define a space for receiving a respective word line of the array of monolithic three-dimensional NAND strings.

Each of the plurality of backside recesses 43 can extend substantially parallel to the top surface of the substrate. A backside recess 43 can be vertically bounded by a top surface of an underlying insulating layer 32 and a bottom surface of an overlying insulating layer 32. Each backside recess 43 can have a uniform height throughout or may have a thickness variation. Optionally, a backside blocking dielectric layer (not shown) can be formed in the backside recesses 43. Outer sidewalls of the memory films 50 can be physically exposed within each backside recess 43.

Referring to FIGS. 9A-9D, at least one metallic material can be deposited in the unfilled volumes of the backside recesses 43, over the sidewalls of the backside contact trench 79, and over the top surface of the insulating cap layer 70. As used herein, a metallic material refers to an electrically conductive material that includes at least one metallic element.

The at least one metallic material can be deposited by a conformal deposition method, which can be, for example, chemical vapor deposition (CVD), atomic layer deposition (ALD), electroless plating, electroplating, or a combination thereof. The at least one metallic material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and/or combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the at least one metallic material can comprise a metal such as tungsten and/or metal nitride. In one embodiment, the at least one metallic material for filling the plurality of backside recesses 43 can be a combination of titanium nitride layer and a tungsten fill material. In one embodiment, the metallic material can be deposited by chemical vapor deposition.

The at least one metallic material fills the backside recesses 43, and can form a contiguous metallic material layer (not shown) on the sidewalls of each backside contact trench 79 and over the insulating cap layer 70. A backside cavity is present in the portion of the backside contact trench 79 that is not filled with the contiguous metallic material layer. The deposited metallic materials of the contiguous electrically conductive material layer can be etched back from the sidewalls of each backside contact trench 79 and from above the insulating cap layer 70, for example, by an isotropic etch or an anisotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. Thus, the electrically conductive layer 46 can be the control gate electrodes for the vertical memory devices including the memory stack structures (vertical portions of the memory film 50 and the semiconductor channel layer 60). In other words, each electrically conductive layer 46 can be a word line that functions as a common control gate electrode for the plurality of vertical memory devices.

Referring to FIGS. 10A-10D, an insulating spacer 74 can be formed by deposition of a conformal insulating material layer and an anisotropic etch that removes horizontal portions of the conformal insulating material layer. The insulating spacer 74 includes a dielectric material such as silicon oxide, silicon nitride, a dielectric metal oxide, or a combination thereof. The lateral thickness of the insulating spacer 74 can be in a range from 10 nm to 100 nm, although lesser and greater thicknesses can also be employed.

Referring to FIGS. 11A-11D, horizontal portions of the memory film 50 can be removed to physically expose top surfaces of laterally extending portions of the semiconductor channel layer 60 by an isotropic etch (such as a wet etch) or an anisotropic etch. An anisotropic etch is performed to vertically recess the dielectric pedestal portions 20. Physically exposed portions of the dielectric pedestal structures 20 underneath the backside trench 79 can be at least vertically recessed to form recess regions 220 overlying the recessed surfaces of the dielectric pedestal portions 20. Horizontal and vertical portions of the memory film 50 underlying the backside trench 79 and located above a horizontal plane that includes the recessed top surfaces of the dielectric pedestal portions 20 can be removed to physically expose surfaces of the semiconductor channel layer 60. Formation of the recess regions 220 can be performed prior to, concurrently with, or after removal of the horizontal and vertical portions of the memory film 50 from underneath the backside recess 79.

In one embodiment, recessing of the dielectric pedestal structures 20 from underneath the backside trench 79 can be performed employing a material layer within the memory film 50 as an etch stop layer. In an illustrative example, if the memory film 50 includes a silicon nitride layer as a memory material layer 54 or a dielectric metal oxide layer as a blocking dielectric layer 56, such material layers may be employed as a stopping layer during the vertical recessing of the dielectric pedestal structures 20. In this case, the physically exposed portions of the memory film 50 underneath the backside trench 79 can be removed after recessing of the dielectric pedestal structures 20.

Generally speaking, portions of the memory film 50 are removed within the area of the backside trench 79. Physically exposed regions of the semiconductor channel layer 60 are formed, which include portions of the top surface and the sidewalls of the laterally extending portion of the semiconductor channel layer 60. In one embodiment, a series of etch processes can be performed to remove physically exposed portions of the memory film 50 from underneath the backside trench 79. For example, a series of wet etch processes and/or vapor phase etch processes can be performed to remove the various material layers of the memory film 50 from underneath the backside trench 79.

Subsequent to, or prior to, or concurrently with, the series of etch processes that removes the physically exposed portions of the memory film 50, an etch step including a selective etch process can be performed to recess the dielectric pedestal structures 20 selective to the memory film 50 or selective to the semiconductor material of the semiconductor channel layer 60. The selective etch process may be an anisotropic etch process or an isotropic etch process. Thus, the dielectric material of the dielectric pedestal structures 20 is etched selective to the semiconductor material of the semiconductor channel layer 60 or selective to a material in the memory film 50 in this etch step. If any portion of the memory film 50 is present on the sidewalls of the semiconductor channel layer 60 after formation of the recess regions 220, an additional etch process can be employed to remove portions of the memory film 50 to physically expose the top surface and the sidewalls of the semiconductor material layer 60 underneath the backside trench 79.

The backside trench 79 straddles the dielectric pedestal structures 20. Sidewalls of the semiconductor channel layer 60 are physically exposed to the backside trench 79. Vertical recessing of the physically exposed regions of the dielectric pedestal structures 20 physically exposes the sidewalls of the laterally extending portion of the semiconductor channel layer 60 from underneath the backside trench 79. Thus, the physically exposed regions of the semiconductor channel layer 60 include planar regions of the laterally-extending portion of the semiconductor channel layer 60 that overlie the laterally-extending dielectric core portion of the dielectric core 62 and underlie the backside trench 79, and vertical regions of the laterally-extending portion of the semiconductor channel layer 60 contacting a respective sidewall of the laterally-extending dielectric core portion of the dielectric core 62. Upon vertical recessing of the physically exposed regions of the dielectric pedestal structures 20, the backside trench 79 extends into each of the dielectric pedestal structures 20 to form a respective recessed top surface that is vertically recessed with respect to topmost surfaces of the dielectric pedestal structures 20.

Referring to FIGS. 12A-12D, physically exposed regions of the semiconductor channel layer 60 underneath the backside trench 79 can be converted into source regions 61 by introduction of the electrical dopants therein. For example, an ion implantation process can be performed to dope the physically exposed portions of the semiconductor channel layer 60 with electrical dopants, thereby forming source regions 61. In case the first and second conducive layers (12, 16) include a doped semiconductor material, the source regions 61 can have the same conductivity type as the first and second conductive layers (12, 16). The source regions 61 can be heavily doped to provide electrical conductivity greater than $1.0 \times 10^5$ S/cm.

Each source region 61 can include a horizontal planar portion and a pair of vertical portions extending downward from the horizontal planar portion. The ratio of the height of the vertical portions of the source region 61 to the width of the horizontal planar portion of the source region 61 (as measured along the lengthwise direction of the backside trench 79) can be in a range from 0.5 to 20, and/or in a range from 2 to 10, although lesser and greater ratios can also be employed. Generally speaking, the greater the ratio the height of the vertical portions of the source region 61 to the width of the horizontal planar portion of the source region 61, the greater the effect of increase in the contact area between the source regions 61 and a backside contact via structure (such as a source contact via structure) to be subsequently formed in the backside trench 79.

Referring to FIGS. 13A-13D, a contact via structure 76 can be formed within the backside trench 79. The contact via structure 76 can be formed by depositing at least one conductive material in the backside trench 79 inside the insulating spacer 74. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized, for example, by chemical mechanical planarization (CMP), to remove excess portions from above a horizontal plane including the top surface of the insulating cap layer 70. A remaining continuous portion of the at least one conductive material in the backside contact trenches 79 constitutes a backside contact via structure 76. The contact via structure 76 can be formed directly on the source regions 61, and can function as a source contact via trench.

Subsequently, additional dielectric material layers and additional contact via structures can be formed to provide electrical contact to the drain regions 63 and the electrically conductive layers 46.

The exemplary structure illustrated in FIGS. 13A-13D can include a three-dimensional memory device. The three-dimensional memory device can include an alternating stack (32, 46) of insulating layers 32 and electrically conductive layers 46 located over a substrate (which includes the substrate semiconductor layer 8 at an upper portion thereof); a memory stack structure extending through the alternating stack (32, 42) and comprising a vertical portion of a memory film 50 and a vertical portion of a semiconductor channel layer 60; a laterally-extending portion of the semiconductor channel layer 60 located between the substrate 8 and the alternating stack (32, 46) and adjoined to a bottom end of the vertical portion of the semiconductor channel layer 60; a source region 61 laterally contacting a sidewall of the laterally-extending portion of the semiconductor channel layer 60; and a source contact via structure 76 extending through the alternating stack (32, 46), contacting the source region 62, and having a corrugated (e.g., battlement shaped or up/down stepped) bottom surface (H1, H2, V1, V2) including raised horizontal bottom surface portions H1 (that contact the planar top portion of the source regions 61) and recessed horizontal bottom surface portions H2 (that contact recessed surfaces of the dielectric pedestal portions 20) adjoined by interconnecting sidewall surfaces (V1, V2) (that contact the sidewalls of the source regions 61).

Each memory opening can include a memory stack structure, which includes a respective vertical portion of the semiconductor channel layer 60 and a respective vertical portion of the memory film 50. A vertical portion of a dielectric core 62 can be located in each memory opening.

In one embodiment, each source region 61 can contact one of the raised horizontal bottom surface portions of the corrugated bottom surface of the source contact via structure 76 and a pair of interconnecting sidewall surfaces of the source contact via structure 61.

Figure 13A:
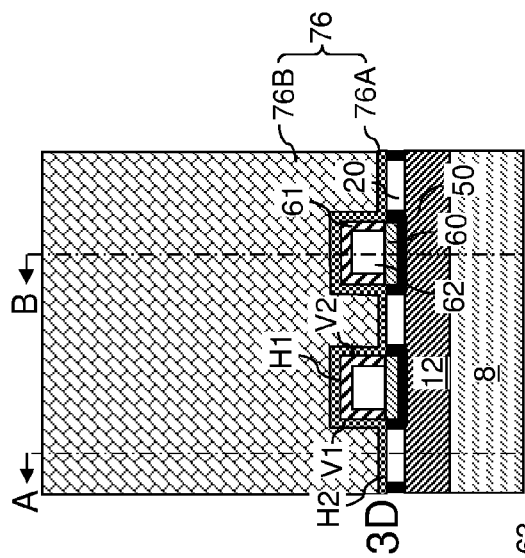
FIG. 13A is a first vertical cross-sectional view of the exemplary structure after formation of a source contact via structure according to an embodiment of the present disclosure.
Figure 13B:
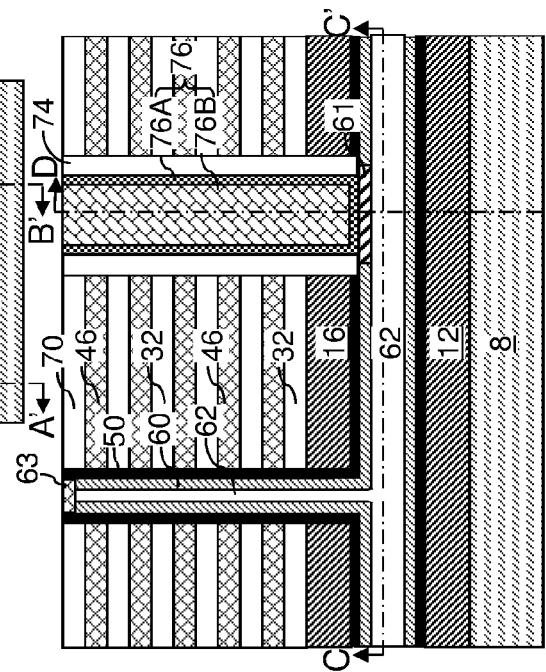
FIG. 13B is a second vertical cross-sectional view of the exemplary structure of FIG. 13A.

In one embodiment, the three-dimensional memory device can include a dielectric pedestal structure 20 having two planar top surfaces (T1, T2), a recessed top surface R1, and a pair of sidewalls (S1, S2) that connect the recessed top surface R1 to a respective one of the two top surfaces (T1, T2). The recessed top surface R1 can contact one of the recessed horizontal bottom surface portions of the source contact via structure 76 as illustrated in FIG. 13A. In one embodiment, bottom portions of two vertical sidewalls (W1, W2) of the source contact via structure 76 can contact the pair of sidewalls (S1, S2) of the dielectric pedestal structure 20 as illustrated in FIG. 13A.

In one embodiment, the two vertical sidewalls (W1, W2) of the source contact via structure 76 extend through the alternating stack (32, 46), and are adjoined to respective edges of the corrugated bottom surface (H1, H2, V1, V2) that have a vertically undulating profile.

Figure 13C:
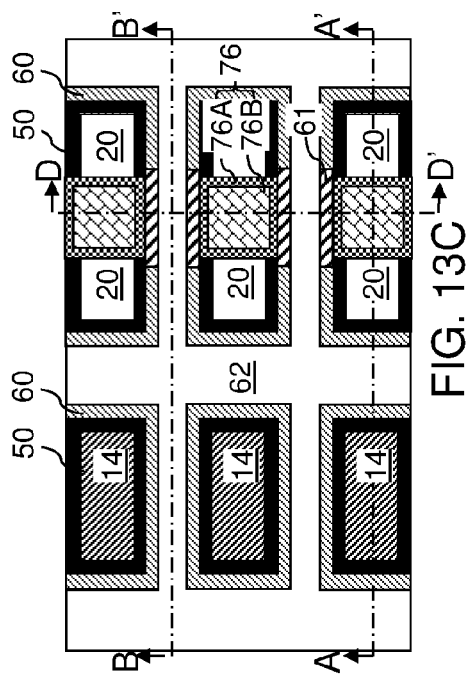
FIG. 13C is a horizontal cross-sectional view of the exemplary structure of FIGS. 13A and 13B along the plane C-C'.
Figure 13D:
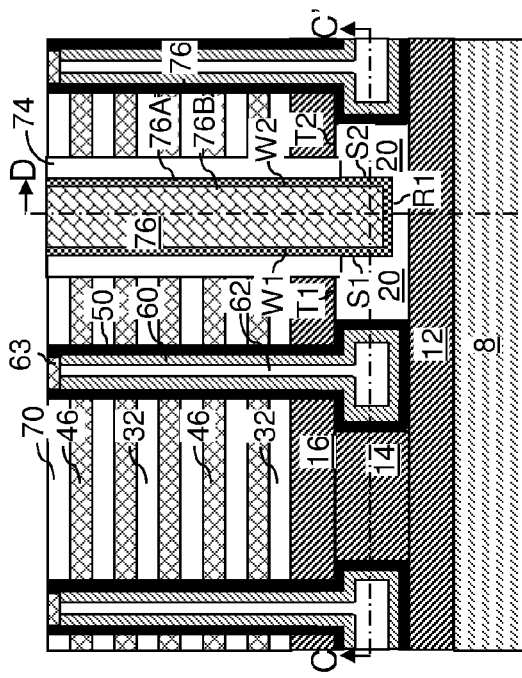
FIG. 13D is a third vertical cross-sectional view of the exemplary structure of FIGS. 13A, 13B, and 13C along the plane D-D'.

In one embodiment, the three-dimensional memory structure can comprise a dielectric core 62 including a vertical dielectric core portion that is laterally surrounded by the vertical portion of the semiconductor channel layer 60 (and located within a memory opening) and a laterally-extending dielectric core portion located between the substrate 8 and the alternating stack (32, 46). In one embodiment, the laterally-extending dielectric core portion has a horizontal cross-sectional shape of a criss-cross grid that defines enclosed regions of the laterally laterally-extending dielectric core portion as illustrated in FIG. 13C. In one embodiment, the enclosed regions can comprise first regions in which a respective conductive pedestal structure 14 is present, and second regions in which a respective dielectric pedestal structure 20 is present.

In one embodiment, the three-dimensional memory structure can include a first conductive layer 12 located above the substrate 8 and contacting a respective bottom surface of each of the conductive pedestal structures 14, and a second conductive layer 16 located underneath the alternating stack (32, 46) and contacting a respective top surface of each of the conductive pedestal structures 14. In one embodiment, the first conductive layer 12, the second conductive layer 16, and the conductive pedestals 14 can include semiconductor materials having a doping of the same conductivity type (which may be n-type or p-type).

In one embodiment, the memory film 50 can continuously extend on surfaces of the vertical portion and the laterally-extending portion of the semiconductor channel layer 60, and can contact sidewalls of the dielectric pedestal structures 20. In one embodiment, the dielectric pedestal structures 20 can contact a bottom surface of the second conductive layer 16 and a top surface of the first conductive layer 12.

In one embodiment, the three-dimensional memory device can include additional memory stack structures extending through the alternating stack (32, 46) and comprising a respective additional vertical portion of the memory film 50 and a respective additional vertical portion of the semiconductor channel layer 60. Each bottom end of the additional vertical portions of the semiconductor channel layer 60 is adjoined to the laterally-extending portion of the semiconductor channel layer 60.

In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 8 can comprise a silicon substrate. The monolithic three-dimensional NAND memory device can comprise an array of monolithic three-dimensional NAND strings over the silicon substrate. Each monolithic three-dimensional NAND string can include a vertical field effect transistor including the source regions 61, the laterally extending portion of the semiconductor channel layer 60, a vertically extending portion of the semiconductor channel layer 60 located within a memory opening, a drain region 63 connected to a top end of the vertically extending portion of the semiconductor channel layer 60, a plurality of charge storage elements as embodied as portion of the memory material layer 54 located at each level of the electrically conductive layers 46 and laterally spaced from the vertically extending portion of the semiconductor channel layer 60 by a respective portion of the tunneling dielectric layer 56, portions of the blocking dielectric layer 52 located adjacent to the plurality of charge storage elements, and portions of the electrically conductive layers 46 located adjacent to the portions of the blocking dielectric layer 52 that function as the control gates.

In one embodiment, at least one memory cell in a first device level (i.e., the level of one of the electrically conductive layers 46) of the array of monolithic three-dimensional NAND strings is located over another memory cell in a second device level (i.e., the level of another of the electrically conductive layers 46) of the array of monolithic three-dimensional NAND strings. The silicon substrate can contain an integrated circuit comprising a driver circuit for the memory device located thereon. The array of monolithic three-dimensional NAND strings can comprise: a plurality of vertical portions of the semiconductor channel layer 60 extending substantially perpendicular to a top surface of the substrate 8; a plurality of charge storage elements (as embodied as portions of the memory material layer 54 at the levels of the electrically conductive layers 46) located in the memory film 50, each charge storage element located adjacent to a respective vertical portion of semiconductor channel layer 60; and a plurality of control gate electrodes (as embodied as the electrically conductive layers 46) having a strip shape extending substantially parallel to the top surface of the substrate, the plurality of control gate electrodes comprise at least a first control gate electrode located in a first device level and a second control gate electrode located in a second device level.

The structure of the present disclosure includes a source contact via structure 76 including a corrugated bottom surface. The total area of the corrugated bottom surface is greater than the horizontal cross-sectional area of the source contact via structure 76. Thus, the total interface area between the source regions 61 and the source contact via structure 76 can be greater than the horizontal cross-sectional area of the source contact via structure 76. The increased interface area between the source regions 61 and the source contact via structure 76 can be advantageously employed to reduce the contact resistance between the source regions 61 and the source contact via structure 76. Generally speaking, the greater the ratio of the height of the vertical portions of the source region 61 to the width of the horizontal planar portion of the source region 61, the greater the increase in the interface area between the source regions 61 and the source contact via structure 76 relative to a reference structure employing a planar bottom surface of a source contact via structure and a planar top surface of a source region. Further, the narrower the dielectric pillar structures 20 along the lengthwise direction of the source contact via structure 76 and/or the narrower the source regions 61 along the lengthwise direction of the source contact via structure 76, the greater the increase in the interface area between the source regions 61 and the source contact via structure 76 relative to the reference structure. The reduction in the contact resistance between the source regions 61 and the source contact via structure 76 can be advantageously employed to increase the on-current of the field effect transistors in the three-dimensional memory device, or to reduce the overall area allocated to the source contact via structure 76 and to scale down the three-dimensional memory device.

Another way to describe the structure of FIGS. 13A-13D is that a rail extending in a first horizontal direction and having a semiconductor channel 60 and/or drain 61 on its sidewalls extends perpendicular to the rail shaped source contact via structure 76, which extends in a perpendicular second horizontal direction. The rail shaped source contact via structure 76 extends over and contacts the semiconductor channel 60 and/or drain 61 on sidewalls of the rail. This sidewall dovetail contact between intersecting, dovetailed rails increases the area of contact between the semiconductor channel 60 and/or drain 61 and source contact via structure 76 and lowers the contact resistance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
a memory stack structure extending through the alternating stack and comprising a vertical portion of a memory film and a vertical portion of a semiconductor channel layer;
a laterally-extending portion of the semiconductor channel layer located between the substrate and the alternating stack and adjoined to a bottom end of the vertical portion of the semiconductor channel layer;
a source region laterally contacting a sidewall of the laterally-extending portion of the semiconductor channel layer; and
a source contact via structure extending through the alternating stack, contacting the source region, and having a corrugated bottom surface including raised horizontal bottom surface portions and recessed horizontal bottom surface portions adjoined by interconnecting sidewall surfaces.

2. The three-dimensional memory device of claim 1, wherein the source region contacts one of the raised horizontal bottom surface portions and a pair of interconnecting sidewall surfaces of the source contact via structure.

3. The three-dimensional memory device of claim 1, further comprising a dielectric pedestal structure having two planar top surfaces, a recessed top surface, and a pair of sidewalls that connect the recessed top surface to a respective one of the two top surfaces, wherein the recessed top surface contacts one of the recessed horizontal bottom surface portions of the source contact via structure.

4. The three-dimensional memory device of claim 3, wherein bottom portions of two vertical sidewalls of the source contact via structure contact the pair of sidewalls of the dielectric pedestal structure.

5. The three-dimensional memory device of claim 4, wherein the two vertical sidewalls of the source contact via structure extend through the alternating stack, and are adjoined to respective edges of the corrugated bottom surface that have a vertically undulating profile.

6. The three-dimensional memory device of claim 1, further comprising a dielectric core including a vertical dielectric core portion that is laterally surrounded by the vertical portion of the semiconductor channel layer and a laterally-extending dielectric core portion located between the substrate and the alternating stack.

7. The three-dimensional memory device of claim 6, wherein the laterally-extending dielectric core portion has a horizontal cross-sectional shape of a criss-cross grid that defines enclosed regions of the laterally laterally-extending dielectric core portion.

8. The three-dimensional memory device of claim 7, wherein the enclosed regions comprise:
first regions in which a respective conductive pedestal structure is present; and
second regions in which a respective dielectric pedestal structure is present.

9. The three-dimensional memory device of claim 8, further comprising:
a first conductive layer located above the substrate and contacting a respective bottom surface of each of the conductive pedestal structures; and
a second conductive layer located underneath the alternating stack and contacting a respective top surface of each of the conductive pedestal structures,
wherein the first conductive layer, the second conductive layer, and the conductive pedestals have a doping of a same conductivity type.

10. The three-dimensional memory device of claim 9, wherein the memory film continuously extends on surfaces of the vertical portion and the laterally-extending portion of the semiconductor channel layer and contacts sidewalls of the dielectric pedestal structures.

11. The three-dimensional memory device of claim 9, wherein the dielectric pedestal structures contact a bottom surface of the second conductive layer and a top surface of the first conductive layer.

12. The three-dimensional memory device of claim 1, further comprising additional memory stack structures extending through the alternating stack and comprising a respective additional vertical portion of the memory film and a respective additional vertical portion of the semiconductor channel layer, wherein each bottom end of the additional vertical portions of the semiconductor channel layer is adjoined to the laterally-extending portion of the semiconductor channel layer.

13. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of vertical portions of the semiconductor channel layer extending substantially perpendicular to a top surface of the substrate;
a plurality of charge storage elements located in the memory film, each charge storage element located adjacent to a respective vertical portion of the semiconductor channel layer; and
a plurality of control gate electrodes having a strip shape extending substantially parallel to the top surface of the substrate, the plurality of control gate electrodes comprise at least a first control gate electrode located in a first device level and a second control gate electrode located in a second device level.

14. A method of forming a device structure, comprising:
forming dielectric pedestal structures embedded within a sacrificial material layer over a substrate;
forming an alternating stack of insulating layers and spacer material layers over the sacrificial material layer and the dielectric pedestal structures, wherein the spacer material layers are formed as, or are subsequently replaced with, electrically conductive layers;

forming memory openings extending through the alternating stack and down to the sacrificial material layer;

removing the sacrificial material layer selective to the dielectric pedestal structures and the alternating stack;

depositing a memory film and a semiconductor channel layer in a cavity formed by removal of the sacrificial material layer and in the memory openings;

forming a backside trench through the alternating stack within an area that straddles the dielectric pedestal structures, wherein sidewalls of the semiconductor channel layer are physically exposed to the backside trench;

converting physically exposed regions of the semiconductor channel layer underneath the backside trench into a source region by introducing electrical dopants therein; and forming a source contact via structure in contact with the source region within the backside trench.

15. The method of claim 14, wherein physically exposed regions of the dielectric pedestal structures are vertically recessed before the sidewalls of the semiconductor channel layer are physically exposed.

16. The method of claim 14, wherein the backside trench is formed by an etch process that includes an etch step in which a dielectric material of the dielectric pedestal structures is etched selective to a material selected from a semiconductor material of the semiconductor channel layer and a material within the memory film.

17. The method of claim 14, further comprising forming a dielectric core within a remaining unfilled volume of the cavity and the memory openings, wherein the dielectric core comprises vertical dielectric core portions laterally surrounded by a respective vertical portion of the semiconductor channel layer and a laterally-extending dielectric core portion surrounded by a laterally-extending portion of the semiconductor channel layer.

18. The method of claim 17, wherein the physically exposed regions of the semiconductor channel layer comprise:
 planar regions of the laterally-extending portion of the semiconductor channel layer that overlie the laterally-extending dielectric core portion and underlie the backside trench; and
 vertical regions of the laterally-extending portion of the semiconductor channel layer contacting a respective sidewall of the laterally-extending dielectric core portion.

19. The method of claim 18, wherein the laterally-extending dielectric core portion has a horizontal cross-sectional shape of a criss-cross grid that defines enclosed regions of the laterally laterally-extending dielectric core portion.

20. The method of claim 19, further comprising:
 forming a first conductive layer on the substrate, wherein the dielectric pedestal structures are formed on a top surface of the first conductive layer; and
 forming a second conductive layer on top surfaces of the dielectric pedestal structures and the sacrificial material layer.

21. The method of claim 20, further comprising forming conductive pedestal structures on the first conductive layer, wherein the sacrificial material layer embeds the conductive pedestal structures, and wherein the enclosed regions defined by the criss-cross grid comprises:
 first regions in which a respective conductive pedestal structure is present; and
 second regions in which a respective dielectric pedestal structure is present.

22. The method of claim 14, further comprising removing portions of the memory film within an area of the backside trench to provide the physically exposed regions of the semiconductor channel layer.

23. The method of claim 14, wherein the backside trench extends into each of the dielectric pedestal structures to form a respective recessed top surface that is vertically recessed with respect to topmost surfaces of the dielectric pedestal structures.

24. The method of claim 14, wherein the semiconductor channel layer is a single continuous layer including vertical portions located in the memory openings and a laterally-extending portion located between the substrate and the alternating stack and directly adjoined to each of the vertical portions of the semiconductor channel layer.

25. The method of claim 14, wherein:
 the three-dimensional memory device comprises a monolithic three-dimensional NAND memory device;
 the electrically conductive layers comprise, or are electrically connected to, a respective word line of the monolithic three-dimensional NAND memory device;
 the substrate comprises a silicon substrate;
 the monolithic three-dimensional NAND memory device comprises an array of monolithic three-dimensional NAND strings over the silicon substrate;
 at least one memory cell in a first device level of the array of monolithic three-dimensional NAND strings is located over another memory cell in a second device level of the array of monolithic three-dimensional NAND strings;
 the silicon substrate contains an integrated circuit comprising a driver circuit for the memory device located thereon; and
 the array of monolithic three-dimensional NAND strings comprises:
  a plurality of vertical portions of the semiconductor channel layer extending substantially perpendicular to a top surface of the substrate;
  a plurality of charge storage elements located in the memory film, each charge storage element located adjacent to a respective vertical portion of the semiconductor channel layer; and
  a plurality of control gate electrodes having a strip shape extending substantially parallel to the top surface of the substrate, the plurality of control gate electrodes comprise at least a first control gate electrode located in a first device level and a second control gate electrode located in a second device level.

\* \* \* \* \*